(12) United States Patent
Takahashi

(10) Patent No.: US 6,665,049 B1
(45) Date of Patent: Dec. 16, 2003

(54) PHOTOMASK, METHOD FOR MANUFACTURING THE SAME, PROJECTION ALIGNER USING THE PHOTOMASK, AND PROJECTION EXPOSING METHOD

(75) Inventor: Tetsuo Takahashi, Yokohama (JP)

(73) Assignee: Nikon Corporation, Tokyo (JP)

( * ) Notice: Subject to any disclaimer, the term of this patent is extended or adjusted under 35 U.S.C. 154(b) by 12 days.

(21) Appl. No.: 09/807,064

(22) PCT Filed: Aug. 8, 2000

(86) PCT No.: PCT/JP00/05307

§ 371 (c)(1),
(2), (4) Date: Apr. 9, 2001

(87) PCT Pub. No.: WO01/13177

PCT Pub. Date: Feb. 22, 2001

(30) Foreign Application Priority Data

Aug. 10, 1999 (JP) ............................................ 11-226762
Feb. 25, 2000 (JP) ...................................... 2000-049802

(51) Int. Cl.[7] ........................ G03B 27/42; G03B 27/62; G03B 27/32
(52) U.S. Cl. ............................ 355/53; 355/75; 355/77; 430/5
(58) Field of Search ............................ 355/53, 55, 52, 355/77, 75; 430/5, 30, 311

(56) References Cited

U.S. PATENT DOCUMENTS 5,499,076 A * 3/1996 Muraki ........................ 355/53
5,691,088 A * 11/1997 Kubota et al. .................. 430/5
5,781,607 A * 7/1998 Acosta et al. .................. 378/34
2002/0187406 A1 * 12/2002 Magome et al. ............... 430/5

FOREIGN PATENT DOCUMENTS

| EP | 0837365 A1 | | 4/1998 |
|---|---|---|---|
| EP | 1043625 A1 | | 10/2000 |
| EP | 1083462 A1 | | 3/2001 |
| JP | 62-200725 | | 9/1987 |
| JP | 63-6553 | | 1/1988 |
| JP | 5-36590 | | 2/1993 |
| JP | 5-265180 | | 10/1993 |
| JP | 8-64492 | | 3/1996 |
| JP | 8-160597 | | 6/1996 |
| JP | 9-197652 | * | 7/1997 |
| JP | WO99/34255 | | 7/1999 |
| JP | WO99/49366 | | 9/1999 |
| JP | WO99/50712 | | 10/1999 |
| JP | WO99/66370 | | 12/1999 |

* cited by examiner

Primary Examiner—Alan A. Mathews
(74) Attorney, Agent, or Firm—Miles & Stockbridge P.C.

(57) ABSTRACT

The present invention is to provide a photomask which has a sufficient durability to short-wavelength exposure beams, too, and also can prevent any foreign matter from adhering to patterns for transfer. In a photomask on which a transfer pattern to be transferred to an exposure-target substrate 19 is formed and through which a stated exposure beam applied to a pattern surface 1P where the transfer pattern is formed is guided to a projection optical system PL for forming an image of the pattern, the photomask comprises a transmitting plate 3 disposed apart from the pattern surface by a stated interval $d_0$ and having a stated thickness h and a transmission to the exposure beam, and the transmitting plate is substantially square and fulfills a stated condition.

8 Claims, 19 Drawing Sheets

FIG. 9
TANGENTIAL SAGITTAL
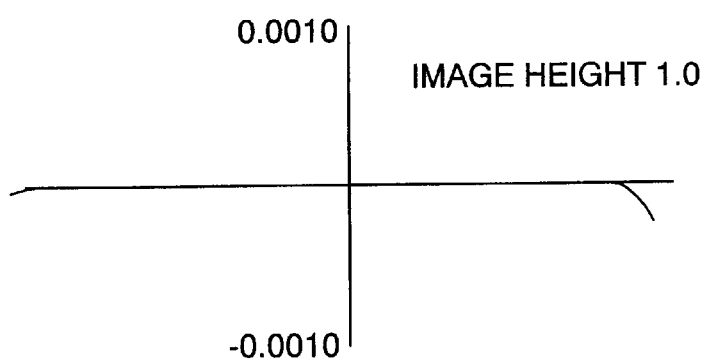
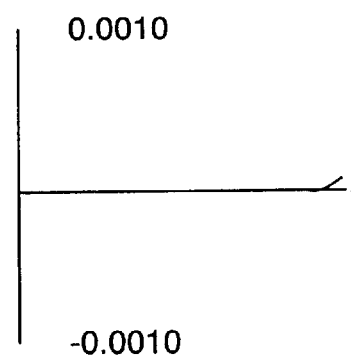
IMAGE HEIGHT 1.0
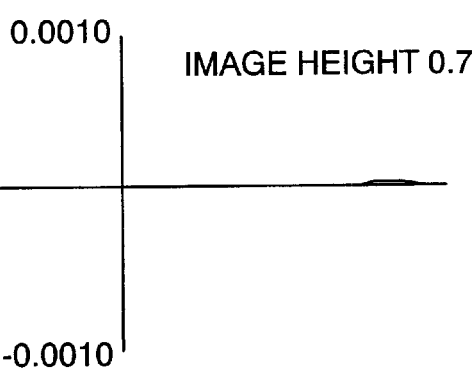
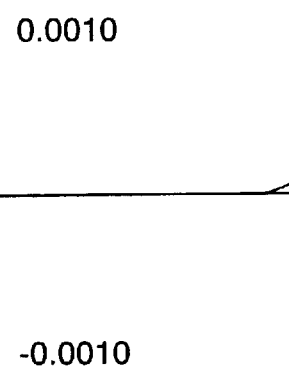
IMAGE HEIGHT 0.7
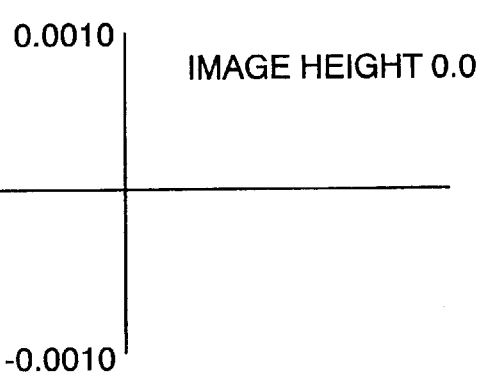
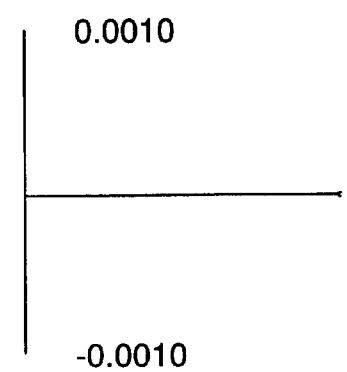
IMAGE HEIGHT 0.0

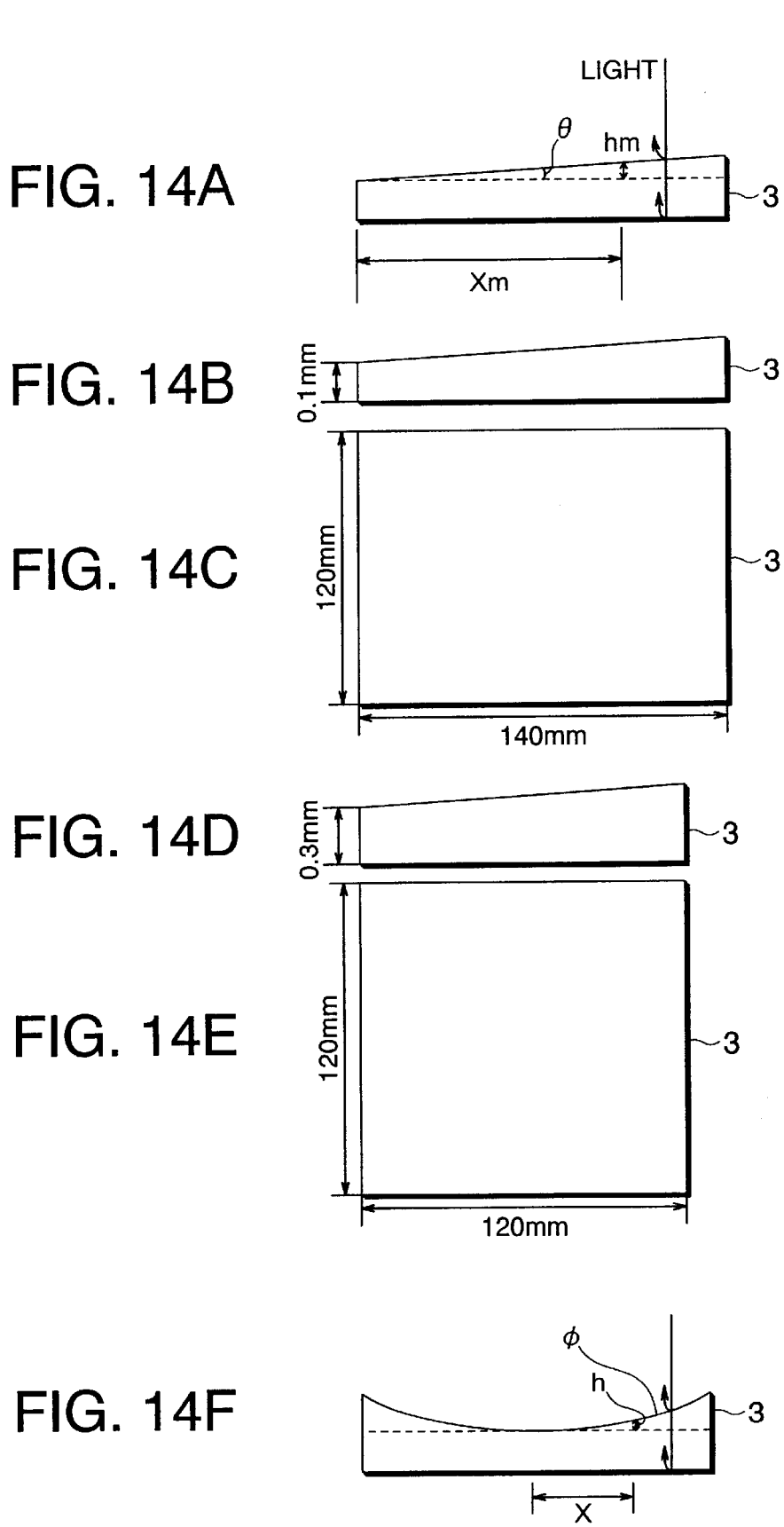

PHOTOMASK, METHOD FOR MANUFACTURING THE SAME, PROJECTION ALIGNER USING THE PHOTOMASK, AND PROJECTION EXPOSING METHOD

TECHNICAL FIELD

This invention relates to a photomask on which a master pattern of patterns has been formed which are to be transferred (projected) onto substrates in lithographic processes for producing devices such as semiconductor integrated circuits, imaging devices (such as CCD), liquid-crystal display devices or thin-film magnetic heads.

BACKGROUND ART

In the fabrication of devices such as semiconductor integrated circuits, a transfer method is used in which, using a photomask having a master pattern of a circuit pattern to be formed, having been magnified, e.g., about four to five times, the pattern of this photomask is reduction-projected on an exposure-target substrate such as a wafer or a glass plate via a reduction projection optical system. What is used when the pattern of such a photomask is transferred is the projection exposure apparatus. Photomasks used in reduction projection type exposure apparatus of a step-and-repeat system or a step-and-scan system are also called reticles.

In the transfer of the pattern of such a photomask, where any foreign matter such as dust with a size larger than tolerance limits stands adherent to the pattern surface, an image of the foreign matter may also inevitably be transferred to the substrate such as a wafer, and there is a possibility that integrated circuits finally manufactured may function erroneously. Accordingly, a thin film called a pellicle which is comprised of an organic material of about 1 to 10 µm thick and transmits exposure light is conventionally spreadingly provided at a position about 5 mm apart from the photomask pattern surface so that the pellicle can prevent the foreign matter from adhering to the pattern surface. Also, the pellicle is spread over a metallic support frame called a pellicle frame bonded to the photomask pattern surface, and the space between the photomask pattern surface and the pellicle is substantially isolated from the open air and is so constructed that any foreign matter contained in the open air does not adhere to the photomask pattern surface.

As stated above, the pellicle comprised of a thin film of an organic material is spread over the pattern surface of any conventional photomask and this pellicle prevents dust from adhering. Also, as exposure light of projection exposure apparatus making use of photomasks, i-rays (wavelength: 365 nm) of mercury lamps have chiefly be used in conventional apparatus, where even conventional pellicles have a sufficient durability against exposure light having a wavelength of such a level.

On the other hand, exposure wavelengths of projection exposure apparatus are recently being replaced with much shorter wavelengths in order to make adaptation to semiconductor integrated circuits having been made finer, and recently KrF excimer laser light (wavelength: 248) is becoming prevailing. Then, at present, shorter-wavelength ArF excimer laser light (wavelength: 193 nm) is being on the stage of practical use. A projection exposure apparatus making use of much shorter-wavelength $F_2$ laser light (wavelength: 157 nm) is also on research.

As exposure wavelengths are replaced with such shorter wavelengths, it has become difficult for conventional organic type pellicles to ensure a sufficient durability. More specifically, since exposure light having a shorter wavelength has a higher energy per one photon, chemical bonds of organic molecules constituting a pellicle may be broken by exposure light. Hence, it is becoming difficult to provide a pellicle comprised of an organic material sufficiently durable to short-wavelength exposure light.

However, if the pellicle is not used, the foreign matter can not be prevented from adhering to the photomask pattern surface, bringing about a difficulty that the manufacture of semiconductor integrated circuits results in a low yield.

Accordingly, it is desirable that any substance other than the pellicle comprised of an organic material be installed in the vicinity of the position where the pellicle has conventionally been provided. Conventional pellicles are workable in very thin gage and moreover soft, and hence any optical influence is almost negligible as long as deflection is removed by applying a tension. However, almost no substance is known which has the same nature as conventional pellicles in respect of exposure light of 200 nm shorter and yet can ensure transmittance.

In the case when the exposure light of 200 nm or shorter is used, it is also known that impurities such as moisture and organic matter present there may contaminate light transmission surface or cause a decrease in transmittance through space. Accordingly, the greatest possible care must also be taken for contamination of any light transmission surface of an article corresponding to the pellicle provided at the position set on the same optical path of the pellicle.

In addition, as disclosed in WO99/49366, it is proposed to use a transmitting plate in place of conventional pellicles as a countermeasure for the trend toward shorter wavelength of exposure light. However, some problems may arise when such a transmitting plate is used. First, the transmitting plate has a considerable thickness compared with the pellicle, and hence it is necessary to measure a figure tolerance (surface precision) on the pellicle side and the projection lens side. However, in the measurement of the figure tolerance (surface precision), where the both surfaces are flat and substantially in parallel, fringes of equal-thickness interference occur when light is made incident on the surfaces. An influence of such fringes of equal-thickness interference provides a problem that it is difficult to analyze interference fringes for measuring the figure tolerance (surface precision).

There is also a problem that aberrations may occur since the transmitting plate having a thickness is inserted in the optical path to any reduction projection optical system in which various aberrations have been well corrected in the state where any transmitting plate is not present. To cope with this problem, as disclosed in WO99/49366, a method is proposed in which the space between lenses of a reduction projection optical system is adjusted according to the thickness of the transmitting plate. This method may be easy and effective because any lens component may be moved in a relatively small extent when, e.g., the error (aberration) is regulated in the state the transmitting plate has a thickness set previously. However, where a plurality of reticles having transmitting plates in various thickness are used, the lens component must be moved in so large an extent that there is a possibility of exceeding the stroke of adjustment which is the range within which the lens is movable. Also, even if it is moved within the adjustable range, residual aberrations may occur.

Moreover, in the case when the transmitting plate is inserted to the optical system, it is preferable for the transmitting plate not to lower the transmittance as far as possible, i.e., to be low reflective. In addition, it is preferable to cause flare or the like as less as possible.

DISCLOSURE OF THE INVENTION

The present invention was made taking account of the problems discussed above. Accordingly, an object of the present invention is to provide a photomask which has a sufficient durability to short-wavelength exposure beams, too, and also can prevent any foreign matter from adhering to patterns for transfer.

Another object of the present invention is to provide a photomask which is a photomask having a transmitting plate and in which the figure tolerance (surface precision) of the transmitting plate can be measured with ease and also the transmitting plate is low reflective, and to provide a photomask, and a projection exposure apparatus, which can make aberrations less occur even when the transmitting plate has a variety in thickness.

To achieve the above objects, first invention provides a photomask on which a transfer pattern to be transferred to an exposure-target substrate is formed and through which a stated exposure beam applied to a pattern surface where the transfer pattern is formed is guided to a projection optical system for forming an image of the pattern;

the photomask comprising a transmitting plate disposed apart from the pattern surface by a stated interval and having a stated thickness and a transmission to the exposure beam;

the transmitting plate being substantially square and fulfilling the following condition:

$$h \geq \frac{60}{|\beta|\lambda} \frac{n-1}{n} 0.0013 \frac{\rho}{F} a^3 \quad (1)$$

where;

h: thickness (cm) of the transmitting plate;

n: refractive index of the transmitting plate with respect to the exposure beam;

β: magnification of the projection optical system;

λ: wavelength (cm) of the exposure beam; and

ρ: density (g/cm³) of the transmitting plate; and where Young's modulus is represented by E and Poisson's ratio is represented by σ, $$E=E/(12 \cdot (1-\sigma^2)) \quad (2).$$

Second invention is that, in the 1st invention, the photomask may preferably fulfill at least one condition of the following conditions (a) to (c).

$$|\Delta T| \leq 0.1\lambda, \quad (a)$$

$$|\Delta \Phi| \leq 0.1\lambda, \quad (b)$$

$$|\Delta n| \times h \leq 0.1\lambda, \quad (c)$$

where;

λ: wavelength (cm) of the exposure beam;

ΔT: difference (cm) in thickness of the transmitting plate between its maximum value and its minimum value;

ΔΦ: difference (cm) in isophase plane of plane waves between its maximum value and its minimum value; the plane waves having passed through the transmitting plate when plane waves are made incident on the transmitting plate;

Δn: difference in refractive index of the transmitting plate with respect to the exposure beam, between its maximum value and its minimum value; and h: thickness (cm) of the transmitting plate.

Third invention is that, in a photomask which has a pattern surface where a pattern for transfer has been formed, and is to be irradiated by a stated exposure beam;

the photomask comprises a transmitting plate disposed apart from the pattern surface by a stated interval; and the transmitting plate fulfills at least one condition of the above conditions (a) to (c).

Fourth invention is that, in the 1st invention to 3rd invention, the photomask may preferably fulfill the following condition.

$$A < \frac{1}{5} d_o \tan\left(\sin^{-1}\frac{NA}{|\beta|}\right) + \frac{1}{10} d \tan\left(\sin^{-1}\frac{NA}{|\beta|n}\right) \quad (13)$$

where;

A: size (cm) of a defect the transmitting plate has;

$d_0$: distance (cm) between the pattern surface and the transmitting plate;

NA: numerical aperture on the image side of the projection optical system;

β: magnification of the projection optical system;

d: thickness (cm) of the transmitting plate; and n: refractive index of the transmitting plate with respect to the exposure beam.

Fifth invention is a photomask on which a transfer pattern to be transferred to an exposure-target substrate is formed and through which a stated exposure beam applied to a pattern surface where the transfer pattern is formed is guided to a projection optical system for forming an image of the pattern;

the photomask comprising a transmitting plate disposed apart from the pattern surface by a stated interval;

the transmitting plate fulfilling the above condition (13).

Sixth invention provides an exposure process comprising the steps of;

exposing the photomask according to any one of the first invention to third invention, to exposure light of 200 nm or shorter wavelength; and transferring the pattern formed on the photomask, onto a photosensitive substrate in accordance with the exposure light.

Seventh invention is that, in the 1st invention, the transmitting plate may preferably be simple-supported and fulfill the condition of:

$$h \geq \frac{60}{|\beta|\lambda} \frac{n-1}{n} 0.0041 \frac{\rho}{F} a^3 \quad (3)$$

In eighth invention, in the photomask according to the first invention, the transmitting plate may preferably be peripheral-supported.

In ninth invention, in the photomask according to the 1st, 2nd, 3rd, 5th, 6th, 7th or 8th invention, the exposure beam may preferably be polarized light, and the transmitting plate may preferably have a distortion of 0.1λ or below.

In tenth invention, in the photomask according to the 1st, 2nd, 3rd, 5th, 6th, 7th, 8th or 9th invention, the transmitting plate may preferably be bonded in the state of optical contact at a position outside the region where the pattern has been formed.

Eleventh invention is a process for producing a photomask on which a transfer pattern for transfer is formed and which is to be irradiated by a stated exposure beam; the process comprising;

a first step of preparing a transmitting plate having transmission to the exposure beam;

a second step of forming on the photomask a pattern for transfer;

a third step of measuring the distortion of the pattern;

a fourth step of calculating the figure (surface form) of the transmitting plate which figure (surface form) may substantially cancel the distortion component;

a fifth step of working the photomask so as to provide the figure (surface form) calculated in the fourth step; and a sixth step of attaching the transmitting plate to the photomask in such a way that the transmitting plate stands apart by a stated interval from the surface where the pattern for transfer has been formed.

Twelfth invention is a process for producing a photomask to be mounted on a projection exposure apparatus with which a pattern for transfer is projection-exposed onto a photosensitive substrate via a projection optical system; the process comprising;

a first step of preparing a transmitting plate having transmission to the exposure beam;

a second step of forming on the photomask a pattern for transfer;

a third step of calculating a distortion component in accordance with the light coming from the pattern via the transmitting plate and the projection optical system, a fourth step of calculating the figure (surface form) of the transmitting plate which figure (surface form) may substantially cancel the distortion component;

a fifth step of working the transmitting plate prepared in the first step, so as to provide the figure (surface form) calculated in the fourth step; and a sixth step of attaching the transmitting plate worked in the fifth step, to the photomask in such a way that the transmitting plate stands apart by a stated interval from the surface where the pattern for transfer has been formed.

Thirteenth invention provides a photomask on which a pattern for transfer has been formed and which is to be irradiated by a stated exposure beam;

the photomask comprising a transmitting plate disposed apart by a stated interval from the pattern surface where the pattern has been formed and having transmission to the exposure beam;

the transmitting plate having a stated thickness and has a first surface and a second surface through each of which the exposure beam is to be made to pass;

the first surface and second surface being substantially plane surfaces, or curved surfaces having a stated refracting power, and;

where the angle formed by the first surface and the second surface is represented by θ (unit: degree), the refracting power of the first surface by ϕ1 (unit: 1/mm), and the refracting power of the second surface by ϕ2 (unit: 1/mm);

fulfilling at least one condition of two conditions:

$$12.4'' \leq \theta < 3' \qquad (20),$$

$$-1/6{,}940 < \phi1 + \phi2 \leq 1/5{,}000 \qquad (21).$$

Incidentally, when the condition (21) is fulfilled, any one of ϕ1≠0 and ϕ2≠0 is fulfilled.

The conditions (20) and (21) defines conditions for making the fringes of equal-thickness interference less occur and making the measurement of figure tolerance (surface precision) easy. When these conditions are not fulfilled, the fringes of equal-thickness interference may occur greatly and the measurement of figure tolerance (surface precision) may result in a low precision. When at least anyone of the conditions (20) and (21) is fulfilled, decentration aberrations may occur at a very low level or at a level of being correctable with ease.

Fourteenth invention provides a projection exposure apparatus in which a pattern for transfer which has been formed on the pattern surface of a photomask is illuminated by an exposure beam coming from an illumination optical system and an image of the pattern is formed on a photosensitive substrate via a projection optical system; the projection exposure apparatus comprising;

a mask stage for positioning the photomask in the optical path extending between the illumination optical system and the projection optical system; and a mask stage drive for moving the mask stage so that the interval between the pattern surface and the projection optical system comes to be at a given value;

the photomask having a transmitting plate having transmission to the exposure beam, disposed apart from the pattern surface by a stated interval; and the given value being determined in accordance with the thickness of the transmitting plate of the photomask.

Fifteenth invention provides a projection exposure process in which a pattern for transfer which has been formed on the pattern surface of a photomask is illuminated by an exposure beam coming from an illumination optical system and an image of the pattern is formed on a photosensitive substrate via a projection optical system; the process comprising the steps of;

locating the photomask in the optical path extending between the illumination optical system and the projection optical system; and setting the interval between the pattern surface and the projection optical system at a given value;

the photomask having a transmitting plate having transmission to the exposure beam, disposed apart from the pattern surface by a stated interval; and the given value being determined in accordance with the thickness of the transmitting plate of the photomask.

Sixteenth invention provides a photomask to be mounted in a projection exposure apparatus with which a pattern for transfer which has been formed on the pattern surface of the photomask is projection-exposed onto a photosensitive substrate by the aid of an exposure beam;

the photomask comprising;

a transmitting plate having transmission to the exposure beam, disposed apart from the pattern surface by a stated interval; and a mounting surface supported by a mask stage of the projection exposure apparatus;

the mounting surface of the photomask and the pattern surface being set apart by a stated distance in the thickness direction of the transmitting plate;

the stated distance being determined taking account of the thickness of the transmitting plate.

Seventeenth invention provides a photomask to be mounted in a projection exposure apparatus with which a pattern for transfer which has been formed on the pattern surface of the photomask is projection-exposed onto a photosensitive substrate by the aid of an exposure beam;

the photomask comprising;

a transmitting plate having transmission to the exposure beam, disposed apart from the pattern surface by a stated interval;

the transmitting plate being provided with an antireflection coating having a fluoride.

In eighteenth invention, the fluoride may preferably contain at least any one of $LaF_3$ and $MgF_2$.

Nineteen invention provides a projection exposure process comprising the steps of;

illuminating the photomask according to any one of the 7th to 10th, 13th and 16th to 18th invention by the aid of the exposure beam coming from the illumination optical system; and forming on a photosensitive substrate via the projection optical system an image of a pattern for transfer which has been formed on the photomask.

Twentieth invention provides the photomask according to any one of the 7th to 10th, 13th and 16th to 18th invention, which fulfills at least one condition of the following conditions (a'), (b') and (c).

$$|\Delta Tc'| \leq 0.1\lambda, \quad (a')$$

$$|\Delta \Phi c'| \leq 0.1\lambda, \quad (b')$$

$$|\Delta n| \times h < 0.1\lambda, \quad (c)$$

where;

$\lambda$: wavelength (m) of the exposure beam;

$\Delta Tc'$: maximum width (cm) of deviation of the thickness of the transmitting plate from a linear approximation obtained when the thickness is linearly approximated;

$\Delta \Phi c'$: maximum width (cm) of deviation of the isophase plane of plane waves made incident on the transmitting plate and having passed through the transmitting plate, from a linear approximation obtained when the isophase plane is linearly approximated;

$\Delta n$: difference in refractive index of the transmitting plate with respect to the exposure beam, between its maximum value and its minimum value; and h: thickness (cm) of the transmitting plate.

Twenty-first invention is that, in a photomask which has a pattern surface where a pattern for transfer has been formed, and is to be irradiated by a stated exposure beam;

the photomask comprises a transmitting plate disposed apart from the pattern surface by a stated interval; and the transmitting plate fulfills at least one condition of the above conditions (a'), (b') and (c).

Here, the $\Delta Tc'$ is found in the following way. First, the thickness of the transmitting plate is approximated in a linear line. Next, an absolute value of the maximum width of deviation of an actual thickness of the transmitting plate from the linear line. Then, this absolute value of the maximum width is represented by $\Delta Tc'$. With regard to the $\Delta \Phi c'$, too, it is similarly found. First the isophase plane of plane waves made incident on the transmitting plate and having passed through the transmitting plate is approximated in a linear line. Then, the absolute value of deviation of the isophase plane from the linear line is represented by $\Delta \Phi c'$.

Twenty-second invention is a process for producing a photomask on which a pattern for transfer is formed and is to be irradiated by a stated exposure beam; the process comprising the steps of;

preparing a transmitting plate having transmission to the exposure beam;

forming on the photomask a pattern for transfer; and attaching the transmitting plate to the photomask in such a way that the transmitting plate stands apart by a stated interval from the surface where the pattern for transfer has been formed;

the step of preparing the transmitting plate having an auxiliary step of examining the transmitting plate.

Twenty-third invention is that, in the photomask production process of the 22nd invention, at least one condition of the following conditions (a'), (b') and (c) is examined in the step of preparing the transmitting plate.

$$|\Delta Tc'| \leq 0.1\lambda, \quad (a')$$

$$|\Delta \Phi c'| \leq 0.1\lambda, \quad (b')$$

$$|\Delta n| \times h \leq 0.1\lambda, \quad (c)$$

where;

$\lambda$: wavelength (m) of the exposure beam;

$\Delta Tc'$: maximum width (cm) of deviation of the thickness of the transmitting plate from a linear approximation obtained when the thickness is linearly approximated;

$\Delta \Phi c'$: maximum width (cm) of deviation of the isophase plane of plane waves made incident on the transmitting plate and having passed through the transmitting plate, from a linear approximation obtained when the isophase plane is linearly approximated;

$\Delta n$: difference in refractive index of the transmitting plate with respect to the exposure beam, between its maximum value and its minimum value; and h: thickness (cm) of the transmitting plate.

Twenty-fourth invention is a process for producing a photomask on which a pattern for transfer is formed and is to be irradiated by a stated exposure beam; the process comprising the steps of;

preparing a transmitting plate having transmission to the exposure beam;

forming on the photomask a pattern for transfer; and attaching the transmitting plate to the photomask in such a way that the transmitting plate stands apart by a stated interval from the surface where the pattern for transfer has been formed;

the transmitting plate having a stated thickness and has a first surface and a second surface through each of which the exposure beam is to be made to pass;

the first surface and second surface being substantially plane surfaces, or curved surfaces having a stated refracting power, and;

where the angle formed by the first surface and the second surface is represented by $\theta$ (unit: degree), the refracting power of the first surface by $\phi 1$ (unit: 1/mm), and the refracting power of the second surface by $\phi 1$ (unit: 1/mm);

fulfilling at least one condition of two conditions:

$$12.4'' \leq \theta < 3' \quad (20),$$

$$-1/6940 < \phi 1 + \phi 2 < 1/5,000 \quad (21),$$

provided that, when the condition (21) is fulfilled, any one of $\phi 1 \neq 0$ and $\phi 2 \neq 0$ is fulfilled.

Twenty-fifth invention is a process for producing a photomask on which a transfer pattern for transfer is formed and which is to be irradiated by an exposure beam of 200 nm or shorter wavelength; the process comprising the steps of;

preparing a transmitting plate having transmission to the exposure beam;

forming on the photomask a pattern for transfer; and attaching the transmitting plate to the photomask in such a way that the transmitting plate stands apart by a stated interval from the surface where the pattern for transfer has been formed;

the process further comprising the step of providing an antireflection coating containing a fluoride.

Twenty-sixth invention is that, in the 25th invention, the fluoride may contain at least any one of $LaF_3$ and $MgF_2$.

Twenty-seventh invention is a process for producing a photomask on which a transfer pattern for transfer is formed and which is to be irradiated by a stated exposure beam; the process comprising the steps of;

preparing a transmitting plate having transmission to the exposure beam;

forming on the photomask a pattern for transfer;

attaching the transmitting plate to the photomask in such a way that the transmitting plate stands apart by a stated interval from the surface where the pattern for transfer has been formed; and providing the photomask with a means for changing the position of the pattern for transfer, over the travel direction of the exposure beam.

Twenty-eighth invention is that, in the production process of the 27th invention, the step of providing the photomask with that means comprises an auxiliary step of providing the photomask with a cutout.

Twenty-ninth invention is that, in the production process of the 27th invention, the step of providing the photomask with that means comprises an auxiliary step of providing the photomask with a protrusion.

Thirtieth invention is that, in the production process of the 27th invention, the step of providing the photomask with that means comprises an auxiliary step of preparing a spacer positioned between a stage mounting portion and a stage, of the photomask.

Thirty-first invention is a photomask on which a pattern for transfer is formed in the plane of a pattern surface and which is to be irradiated by a stated exposure beam;

the photomask comprising;

a transmitting plate having a stated thickness and having transmission to the exposure beam; and a holding member for disposing the transmitting plate apart from the pattern surface by a stated interval;

the holding member holding the transmitting plate in such a way that the angle formed by a light-transmitting surface of the transmitting plate and a surface of the photomask is within 1°.

Thirty-second invention is that, in the photomask of 31st invention, the holding member holds the transmitting plate in such a way that the angle formed by the light-transmitting surface of the transmitting plate and the surface of the photomask is within 5'.

Thirty-third invention is that, in the photomask of 31st invention, the holding member holds the transmitting plate in such a way that the angle formed by the light-transmitting surface of the transmitting plate and the surface of the photomask is within 1'.

Thirty-fourth invention is a process for producing a photomask on which a transfer pattern for transfer is formed in the plane of a pattern surface and which is to be irradiated by a stated exposure beam; the process comprising the steps of;

preparing a transmitting plate having transmission to the exposure beam;

forming on the photomask a pattern for transfer; and attaching the transmitting plate to the photomask in such a way that the transmitting plate stands apart by a stated interval from the surface where the pattern for transfer has been formed;

the step of preparing the transmitting plate being the step of preparing a transmitting plate having a thickness within ±2 µm with respect to a specified vale of the thickness of the transmitting plate.

Thirty-fifth invention is that, in the 32nd invention, the step of preparing the transmitting plate has an auxiliary step of examining the transmitting plate; and in the auxiliary step, the thickness of the transmitting plate is examined.

Thirty-sixth invention is a photomask produced by the production process of the 31st or 32nd invention.

Thirty-seventh invention is a photomask on which a pattern for transfer is formed in the plane of a pattern surface and which is to be irradiated by a stated exposure beam;

the photomask comprising a transmitting plate disposed apart from the pattern surface by a stated interval, having a stated thickness and having a first surface and a second surface through each of which the exposure beam is to be made to pass;

the first surface and second surface standing at a local angle within 0.4"; and the first and second surfaces and pattern surface standing at a local angle within 12".

Thirty-eighth invention is a process for producing a photomask on which a transfer pattern for transfer is formed and which is to be irradiated by a stated exposure beam; the process comprising the steps of;

preparing a transmitting plate having transmission to the exposure beam;

forming on the photomask a pattern for transfer; and attaching the transmitting plate to the photomask in such a way that the transmitting plate stands apart by a stated interval from the surface where the pattern for transfer has been formed;

the transmitting plate having a stated thickness and having a first surface and a second surface through each of which the exposure beam is to be made to pass;

the step of preparing the transmitting plate having an auxiliary step of examining the transmitting plate;

in the auxiliary step, examination being made in relation to a local angle at which the first surface and second surface stand and a local angle at which the first surface and second surface stand with respect to a stated reference surface.

Thirty-ninth invention is that, in the production process of the 36th invention, the first surface and second surface stand at a local angle within 0.4" and, with respect to a stated reference surface, the first surface and the second surface stand at a local angle within 12".

BRIEF DESCRIPTION OF THE DRAWINGS

FIG. 9 shows aberrations of the projection optical system.

FIGS. 14A to 14E illustrate an instance in which the transmitting plate has an inclination, and FIG. 14F an instance in which it has a curvature.

EMBODIMENTS OF THE INVENTION

Embodiments of the photomask according to the present invention will be described below with reference to the accompanying drawings. In the present embodiments, the present invention is applied to photomasks (reticles) used as master plates in projection exposure apparatus making use of short-wavelength exposure light like that of, e.g., an ArF excimer laser (wavelength: 193 nm) or an $F_2$ laser (wavelength: 157 nm).

First Embodiment

Figure 1A:
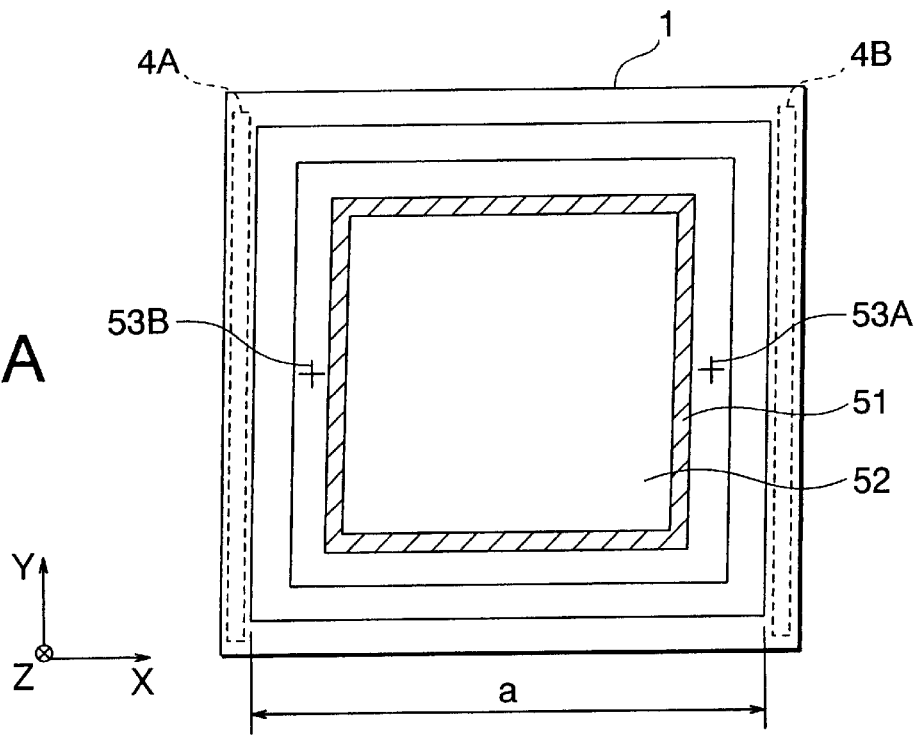
FIGS. 1A and 1B illustrate the construction of a photomask according to First Embodiment.
Figure 1B:
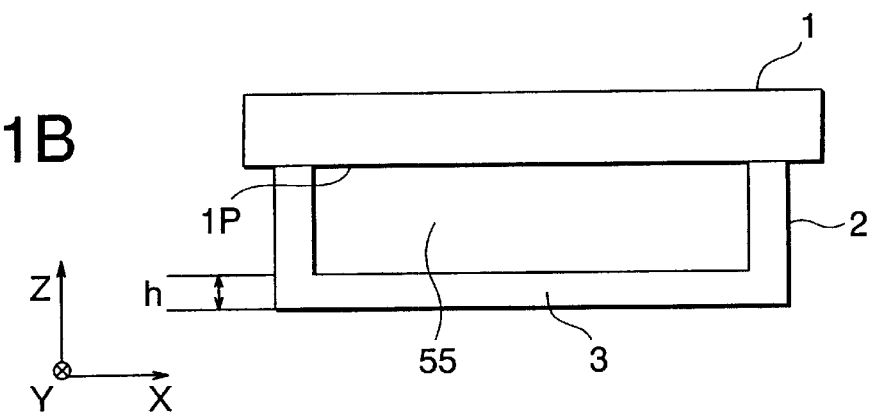

FIG. 1A is a bottom view of a mask 1 of the present embodiment as viewed from its pattern surface side. FIG. 1B is a side view thereof. In FIGS. 1A and 1B, the mask 1 has a rectangular frame-like light-screening band 51 formed at the bottom (under surface) (hereinafter "pattern surface 1P") of a transmitting plate made of quartz glass or fluorite and having transmission to ultraviolet rays, and a pattern region 52 formed on the inside of the light-screening band 51 in which region a master pattern has been drawn. A pair of alignment marks 53A and 53B are also formed on the pattern surface 1P, holding the light-screening band 51 between them.

Then, on the pattern surface 1P, a rectangular frame-like member, holding frame 2 is fixed by bonding (simple-supported) in the state of optical contact, surrounding the light-screening band 51 and the alignment marks 53A and 53B. Being bonded in optical contact, the space between the pattern surface 1P and the holding frame 2 can be made airtight at an improved rate and also the adhesion between them is improved, and hence any mechanical distortion may occur with difficulty. Then, a square plate 3 having transmission to ultraviolet rays of wavelength $\lambda$ and having a thickness h and a side length a is integrally formed using the same material as that of the holding frame 2. Here, the transmitting plate 3 and the holding frame 2 may be made of, e.g., quartz glass ($SiO_2$), fluorite ($CaF_2$) or magnesium fluoride ($MgF_2$), any of which may be used. As the quartz glass, synthetic quartz may also be used. In order to strengthen the durability to short-wavelength light, modified quartz glass may also be used, such as quartz glass doped with fluorine (F), quartz glass doped also with hydrogen in addition to fluorine, quartz glass incorporated with OH groups, and quartz glass containing OH groups in addition to fluorine. Incidentally, in the quartz glass doped with fluorine, the fluorine may preferably be in a concentration of 100 ppm or more, and may more preferably be in the range of 500 ppm to 30,000 ppm. In the quartz glass doped also with hydrogen in addition to fluorine, the hydrogen may preferably be in a concentration of $5 \times 10^{18}$ molecules/cm$^3$ or less, and more preferably $1 \times 10^{16}$ molecules/cm$^3$ or less. Also, in the quartz glass incorporated with OH groups, the OH groups may preferably be in a concentration in the range of 10 ppb to 100 ppm. In the quartz glass also containing OH groups in addition to fluorine, the fluorine may preferably be in a concentration of 100 ppm or more and the OH groups may preferably be in a concentration lower than the fluorine concentration. In this case, the OH groups may also preferably be in a concentration in the range of 10 ppb to 20 ppm. These materials not only have a high transmission to ultraviolet rays, but also have a sufficient durability to the ultraviolet rays. Then, a flat plate made of any of these materials may be worked to have the thickness h by polishing it on its both sides, thus the plate 3 is formed.

Incidentally, the transmitting plate 3 and the holding frame 2 are by no means limited to those integrally formed, and those separately prepared may be fixed by bonding with an adhesive.

The transmitting plate 3 is disposed on the pattern surface 1P of the mask 1 and in parallel to the pattern surface 1P, leaving a stated interval between them. Also, slender two regions extending on the outside of the holding frame 2 on the pattern surface 1P serve as attracting zones 4A and 4B. In a reticle loader system where the mask 1 is transported to and from a projection exposure apparatus described later and in a reticle stage of the projection exposure apparatus, the mask 1 is fixed at its attracting zones 4A and 4B by vacuum attraction or the like. Then, in the present embodiment, space 55 defined by the holding frame 2 and the transmitting plate 3 is kept airtight. Thus, since the space 55 is isolated from the open air, any foreign matter such as dust in the open air is prevented from adhering to the region 52 on the pattern surface 1P, e.g., in the course the mask 1 is transported. In addition, the space 55 may previously be purged with an inert gas such as He, whereby the pattern surface 1P and the mask-side surface of the transmitting plate 3 can be prevented from contamination over a long period of time. Also, at least one side of the transmitting plate 3 may preferably be subjected to surface working to correct mask errors as described later.

Second Embodiment

Figure 2A:
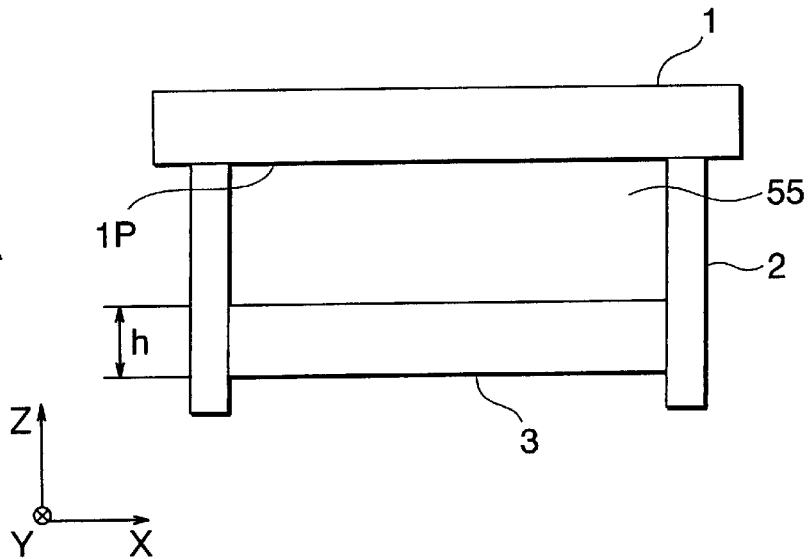
FIG. 2A illustrates the construction of a photomask according to Second Embodiment, and FIG. 2B a different construction.
Figure 2B:
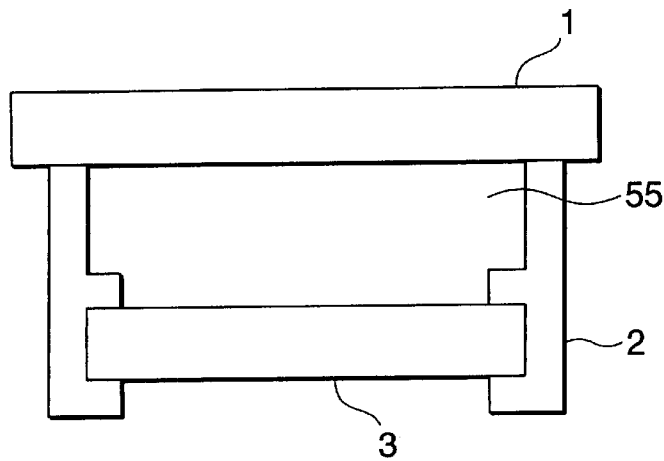

FIG. 2A is a side view of a mask 1 according to Second Embodiment. Its bottom view is the same as that in First Embodiment described above, and is omitted here. In the above First Embodiment, the holding frame 2 and the transmitting plate 3 are integrally formed using the same material, the holding frame 2 and the mask 1 are bonded in the state of optical contact, and the transmitting plate 3 is simple-supported on the mask 1. In contrast thereto, in Second Embodiment, a holding frame 2 formed of a high-strength titanium alloy is fixed to the pattern surface 1P by bonding, and the transmitting plate 3 is further fixed to the holding frame 2 by bonding. More specifically, in the present embodiment, the transmitting plate 3 is peripheral-fixed. Thus, in Second Embodiment, too, the transmitting plate 3 is disposed on the pattern surface 1P of the mask 1 and in parallel to the pattern surface 1P, leaving a stated interval between them. Incidentally, the transmitting plate 3 in the present embodiment may be made of the same material as that used in the above First Embodiment. In addition, like the above First Embodiment, the space 55 may previously be purged with an inert gas such as He, whereby the pattern surface 1P and the mask-side surface of the transmitting plate 3 can be prevented from contamination over a long period of time. Also, at least one side of the transmitting plate 3 may preferably be subjected to surface working to correct mask errors as described later. Also, at least one side of the transmitting plate 3 may preferably be subjected to surface working to correct mask errors as described later. Still also, the transmitting plate 3 may be held under construction as shown in FIG. 2B.

The simple support and peripheral fixing of the transmitting plate as described in the above respective embodiments are described below. As described previously, the thickness h of the transmitting plate may preferably fulfill the condition (1) given previously and fulfill the condition (1) especially when the plate is peripheral-fixed, and, when the plate is simple-supported, may preferably fulfill the condition (3).

Then, since the transmitting plate 3's own weight of suspension is applied to the mask stage, any strain applied to the mask can be small as long as the position at which the mask is held is close to the point of action of the gravity the transmitting plate applies to the mask. Also, the transmitting plate and the holding member for fixing the mask and transmitting plate may each preferably have a small weight, but, as is clear from the condition (1) or the condition (3), the transmitting plate itself has a thickness to a certain extent. Accordingly, the holding frame may preferably have a density of 5 g/cm$^3$ or less. Also, the holding frame may preferably have a high strength and have a tensile strength of 400 MPa or more because such a frame can be made small in volume.

Where a pattern of a photomask having the transmitting plate in a thickness h is projection-exposed onto an exposure-target substrate via a projection optical system, in order to keep the projection optical system from having any serious aberrations, the transmitting plate may preferably fulfill at least one condition of the following conditions (a) to (c).

$|\Delta T| \leq 0.1\lambda,$ (a)

$|\Delta\Phi| \leq 0.1\lambda,$ (b)

$|\Delta n| \times h < 0.1\lambda,$ (c)

where;

λ: wavelength (cm) of the exposure beam;

ΔT: difference (cm) in thickness of the transmitting plate between its maximum value and its minimum value;

ΔΦ: difference (cm) in isophase plane of plane waves between its maximum value and its minimum value; the plane waves having passed through the transmitting plate when plane waves are made incident on the transmitting plate;

Δn: difference in refractive index of the transmitting plate with respect to the exposure beam, between its maximum value and its minimum value; and h: thickness (cm) of the transmitting plate.

If at least one condition of the conditions (a) to (c) is not fulfilled, the projection optical system may have serious distortion and spherical aberration. The transmitting plate may more preferably fulfill at least two conditions of the conditions (a) to (c).

The photomask of the present embodiment is also used in a high-spec projection exposure apparatus making use of exposure light of 200 nm or shorter wavelength. Even when the projection optical system is replaced with a different projection optical system, the photomask may preferably be well usable without depending on any specific state of aberrations each exposure unit may have. Accordingly, the photomask may more preferably fulfill at least one condition of the following conditions (d) to (f).

$|\Delta T| \leq 0.03\lambda;$ (d)

$|\Delta\Phi| \leq 0.03\lambda;$ (e)

$|\Delta n| \times h < 0.03\lambda,$ (f)

In an optical system making use of a beam splitter as disclosed in Japanese Patent Application Laid-open No. 2-66510, it is also common to use two beams of polarized light. In this case, if the transmitting plate 3 has a distortion, the polarized component may be disordered and no good separation may be effected between p-polarized light and s-polarized light to cause flare light unwantedly. Accordingly, the transmitting plate 3 may preferably have a distortion of 0.1λ or less over its whole surface.

Figure 3A:
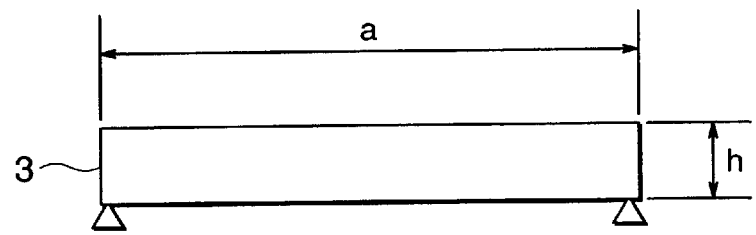
FIGS. 3A and 3B illustrate a simple-supported square plate which undergoes a uniform-distributed load.
Figure 3B:
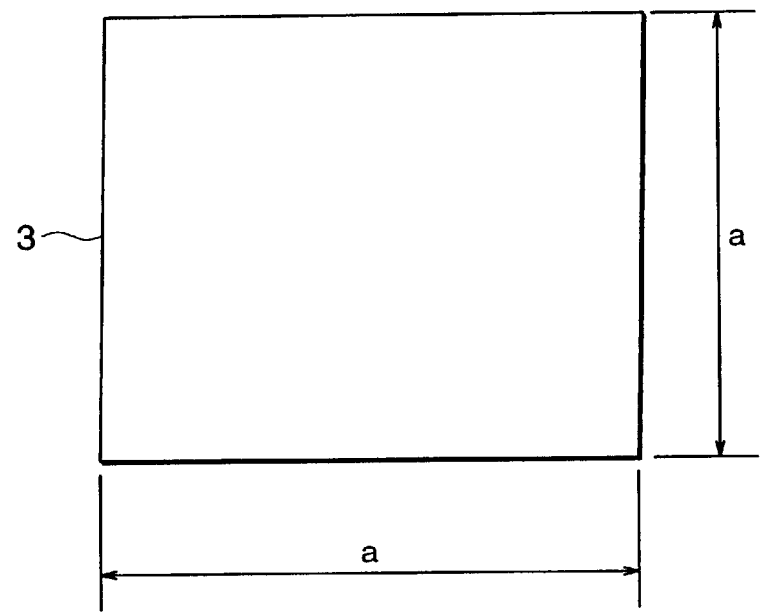

Deflection of the transmitting plate 3 in the cases of simple support (First Embodiment) and peripheral support (Second Embodiment), and distortion caused by such deflection are described below with reference to FIGS. 3 and 4. In general, a maximum deflection $W_{max}$ of a square plate (the transmitting plate 3) in the case when it is supported at its periphery is represented by the following expression.

$$W_{max} \approx \alpha p a^4 / D \qquad (4)$$

Figure 4A:
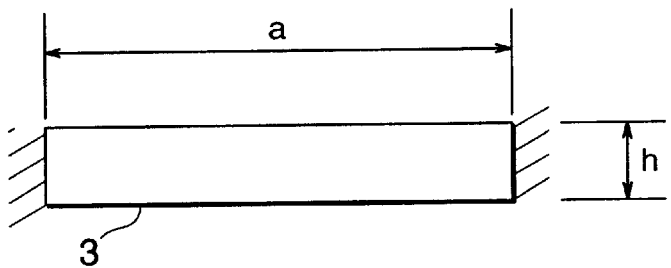
FIG. 4 illustrates a peripheral-fixed square plate which undergoes a peripheral-distributed load.
Figure 4B:
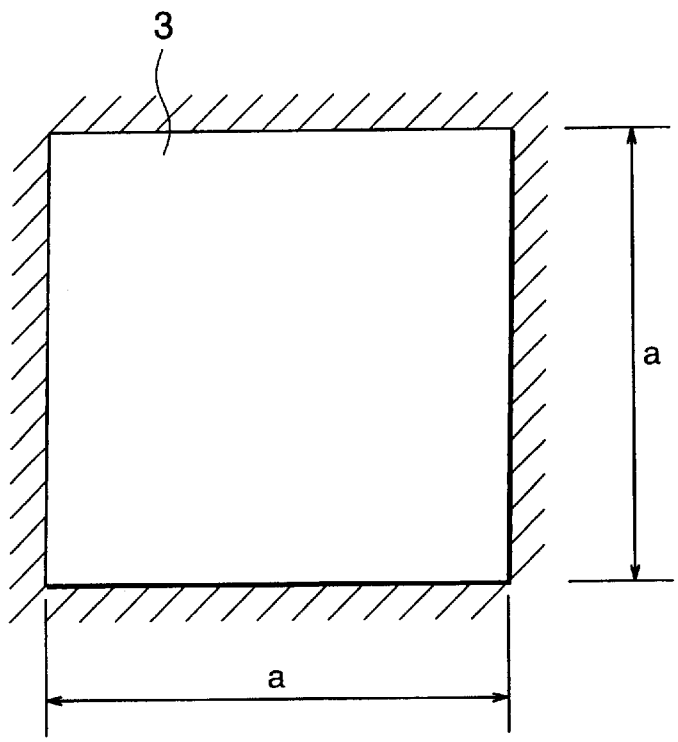

Here, α is a constant of proportion, and is α=0.0041 in the simple support (FIGS. 3A and 3B) and α=0.0013 in the peripheral support or fixing (FIGS. 4A and 4B). Also, a is length of one side of the square transmitting plate 3; and p, pressure per unit area, which corresponds to gravity in the case of thin-sheet glass, and hence p=ρh where ρ represents density of thin-sheet glass (the transmitting plate 3) and h represents thickness of thin-sheet glass (the transmitting plate 3). Also, D is flexural stiffness, and is represented by the formula:

$$D = Eh^3/(12(1-\sigma^2)) = Fh^3 \quad (4)$$

where E represents Young's modulus, and σ, Poisson's ratio.

As can be seen from the above formula (4), the peripheral support or fixing (FIGS. 4A and 4B) is preferred to the simple support (FIGS. 3A and 3B) because the deflection in the former is ⅓ of the latter. Where the transmitting plate 3 has a rectangular shape, the value of α differs a little from the above. However, masks (pattern-formed regions) used actually in projection exposure apparatus are rectangular but fairly closely square in most cases, and hence the length of a long side may preferably be used as the value of α.

Changes in distortion which are caused when the deflection is produced in the transmitting plate 3 are explained below. The distortion is chiefly caused by positional deviation of the principal ray. Accordingly, think about the positional deviation of the principal ray first. Assuming that a projection optical system stands telecentric on the mask side, the deviation of the principal ray is caused by an inclination of the surface of the transmitting plate 3 (thin-sheet glass).

Figure 5:
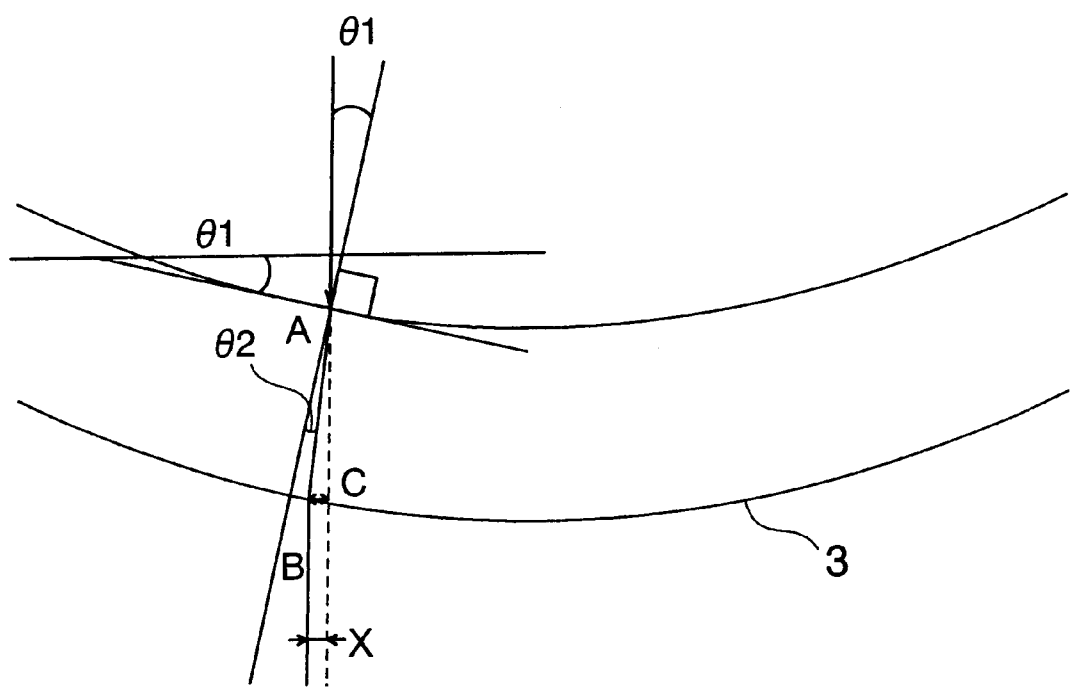
FIG. 5 illustrates how a light ray deviates when the transmitting plate stands inclined by deflection.

In FIG. 5, where the angle of inclination on each side is represented by θ1 since the transmitting plate 3 is substantially flat on both sides, tan(θ1−θ2)=x/h taking account of triangles A, B and C, and hence the extent x of deviation of the light ray is given by x=h·tan(θ1−θ2).

Here, assuming θ1, θ2≈0, it follows that x≈h·tan(θ1−θ2)  (5).

Then, according to the Snell low, substitute θ1=nθ2 (n: refractive index of thin-sheet glass, the transmitting plate 3) for the expression (5), thus it follows that x≈h·θ1·(n−1)/n  (6).

Then, when any influence by deflection is taking into account, the dependence of θ on the light-incident position comes into question. For example, when θ is rotationally symmetric and stands parabolic about the central position of a square as the center of rotational symmetry, θ is proportional to the distance from the central position. Hence, the light-ray deviation is also proportional to only the distance from the central position, and only comes to be a mere magnification component. Also, even in the case of inclination of a higher-degree component, the aberration can be reduced by correcting other lens distance or the like as long as it is a rotationally symmetric component.

However, since in most cases the thin-sheet glass (transmitting plate 3) is in square form, or in rectangular form close to square, after the shape of the mask (the pattern-formed region or light-screening band), it does not deflect in rotational symmetry. Hence, it follows that some aberration is always caused. Such aberration that can not be corrected is caused by the deviation of θ. Average value of θ, θave, is about θave=2 $W_{max}$/a than the maximum deflection $W_{max}$. Since the deviation should also be substantially equal to θave, the θave is substituted for θ1 of the expression (6) to give the following expression:

$$x \approx \frac{n-1}{n} h \frac{2w_{max}}{a}$$

Then the $W_{max}$ of the expression (4) is substituted for the above to give $$x \approx 2\frac{n-1}{n}\alpha\frac{\rho a^3}{Fh} \qquad (7)$$

The extent x of distortion thus produced must be sufficiently small with respect to the line width of the pattern having been formed on the pattern surface. Accordingly, in practical use, it may preferably be λ/10 or less with respect to the exposure wavelength λ even in total of the whole factors. Hence, the extent of distortion tolerable by the thin-sheet glass (transmitting plate 3) comes to be as smaller as λ/30 or less. Aberrations of the projection optical system, movement errors of the mask and stage and so forth may also cause the distortion. Accordingly, the distortion tolerable by the thin-sheet glass (transmitting plate 3) may preferably be λ/100 or less. More specifically, it is $$x \leq \frac{\lambda}{30}|\beta| \qquad (8)$$

and more preferably $$x \leq \frac{\lambda}{100}|\beta| \qquad (9)$$

Expressions (8) and (9) are substituted f or the expression (7) to give $$h \geq \frac{60}{|\beta|\lambda}\frac{n-1}{n}\alpha\frac{\rho}{F}a^3 \qquad (10)$$

Expression (10) is an expression which represents the above conditions (1) and (3) generally.

Then, it is more preferable to satisfy the following expression (11):

$$h \geq \frac{200}{|\beta|\lambda}\frac{n-1}{n}\alpha\frac{\rho}{F}a^3 \qquad (11)$$

If the thin-sheet glass (transmitting plate 3) has a thickness smaller than the above, the distortion may be produced in a high extent.

Figure 6:
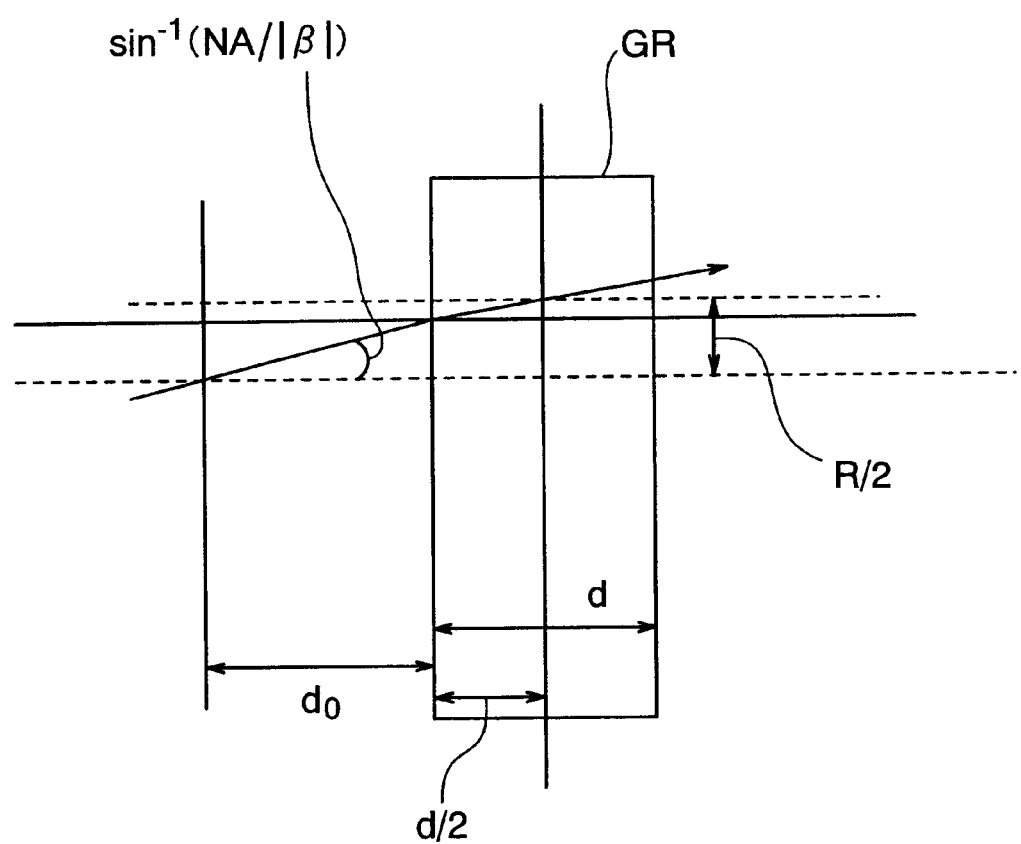
FIG. 6 illustrates spread of outermost peripheral light which exits the mask and passes through thin-sheet glass.

In order to make the projection exposure apparatus have no serious aberrations, it is also preferable to highly precisely keep the quality of the thin-sheet glass itself (the quality of materials for the transmitting plate 3), i.e., it is preferable for the thin-sheet glass not to have any defects in a size larger than the stated value. Among defects of glass plates, bubbles and crusts are discussed here. A light ray having exited the mask spreads in a specific NA. Here, with regard to a sheet of glass GR as shown in FIG. 6, its various numerical values are calculated at its middle position of glass thickness for simplicity. Light-ray diameter R at the middle thickness of the glass GR is determined according to the following expression (12).

$$R = 2d_o\tan\left(\sin^{-1}\frac{NA}{|\beta|}\right) + d\tan\left(\sin^{-1}\frac{NA}{|\beta|n}\right) \qquad (12)$$

Here, the NA stands for a numerical aperture of the projection optical system on its wafer side. Meanwhile, where any defects such as bubbles and crusts are present in the glass, light rays having entered defective portions of the glass GR behave as stray light, or have a vast aberration to cause the aberration of exposure light seriously. Hence, the size of bubbles and crusts is tolerable only up to a size of about 1/100 of the size of a light ray the exposure light has. Accordingly, where the size of diameter of a bubble or crust is represented by A, it follows that $$A \leq R/10.$$

Hence, it is preferable to satisfy the following expression (13).

$$A < \frac{1}{5} d_o \tan\left(\sin^{-1}\frac{NA}{|\beta|}\right) + \frac{1}{10} d\tan\left(\sin^{-1}\frac{NA}{|\beta|n}\right) \quad (13)$$

If the expression (13) is not satisfied, problems may occur such that a low contrast results at the imaging surface (wafer surface) and any specific pattern can not be ressolved. Also, in order to use the mask favorably in various projection optical systems, too, the size of bubbles and crusts may preferably be a size of about 1/1,000 of the size of a light ray the exposure light has. In such a case, since $$A \leq R/(10 \times 10^{1/2}),$$

it is preferable to satisfy the following expression (14).

$$A < \frac{1}{5\sqrt{10}} d_o \tan\left(\sin^{-1}\frac{NA}{|\beta|}\right) + \frac{1}{10\sqrt{10}} d\tan\left(\sin^{-1}\frac{NA}{|\beta|n}\right) \quad (14)$$

If the expression (14) is not satisfied, any specific pattern can not be ressolved in desired pattern line width or under desired conditions for illumination in some projection optical systems.

Factorial values and condition values of the material for the photomask according to the above Embodiments (the material of the transmitting plate 3 is fluorite) are given below in Table 1.

TABLE 1

$E = 7.73 \times 10^8$ (g/cm$^2$)
$\sigma = 0.26$
$F = 6.91 \times 10^7$ (g/cm$^2$)
$\rho = 3.18$ (g/cm$^3$)
$a = 7.5$ (cm)
$\alpha = 0.0013$
$n = 1.56$
$|\beta| = 4$
$\lambda = 157.6 \times 10^{-7}$ (cm)
condition (1) $h \geq 5.97 \times 10^{-3}$ (cm) = 59.7 ($\mu$m)
condition (3) $h \geq 1.882 \times 10^{-2}$ (cm) = 188.2 ($\mu$m)
condition (11) $h \geq 1.990 \times 10^{-3}$ (cm) = 199.0 ($\mu$m)
(wherein $\alpha = 0.0013$)
condition (11) $h \geq 6.275 \times 10^{-2}$ (cm) = 627.5 ($\mu$m)
(wherein $\alpha = 0.0041$)
condition (d) $|\Delta T| \leq 0.03\lambda$
condition (e) $|\Delta\Phi| \leq 0.03\lambda$
condition (f) $|\Delta n| \times h < 0.03\lambda$ The transmitting plate 3 of the photomask in the above Embodiments has a thickness of 5 mm, and hence it fulfills the conditions (1), (3) and (11). It also fulfills all the conditions (d) to (f).

Factorial values relating the defects such as bubbles are given below in Table 2.

TABLE 2

$d_o = 5.5$ (mm)
$d = 5.0$ (mm)
$NA = 0.75$
$|\beta| = 4$
$n = 1.56$
condition (13) A < 0.27 (mm)
condition (14) A < 0.086 (mm) (15)

In the present Embodiment, they fulfill the condition of A<0.086.

[Projection Exposure Apparatus]

An example of a projection exposure apparatus used to transfer a master pattern of the mask (reticle) 1 shown in FIGS. 1A and 1B, to an exposure-target substrate such as a wafer is described below with reference to FIG. 7.

Figure 7:
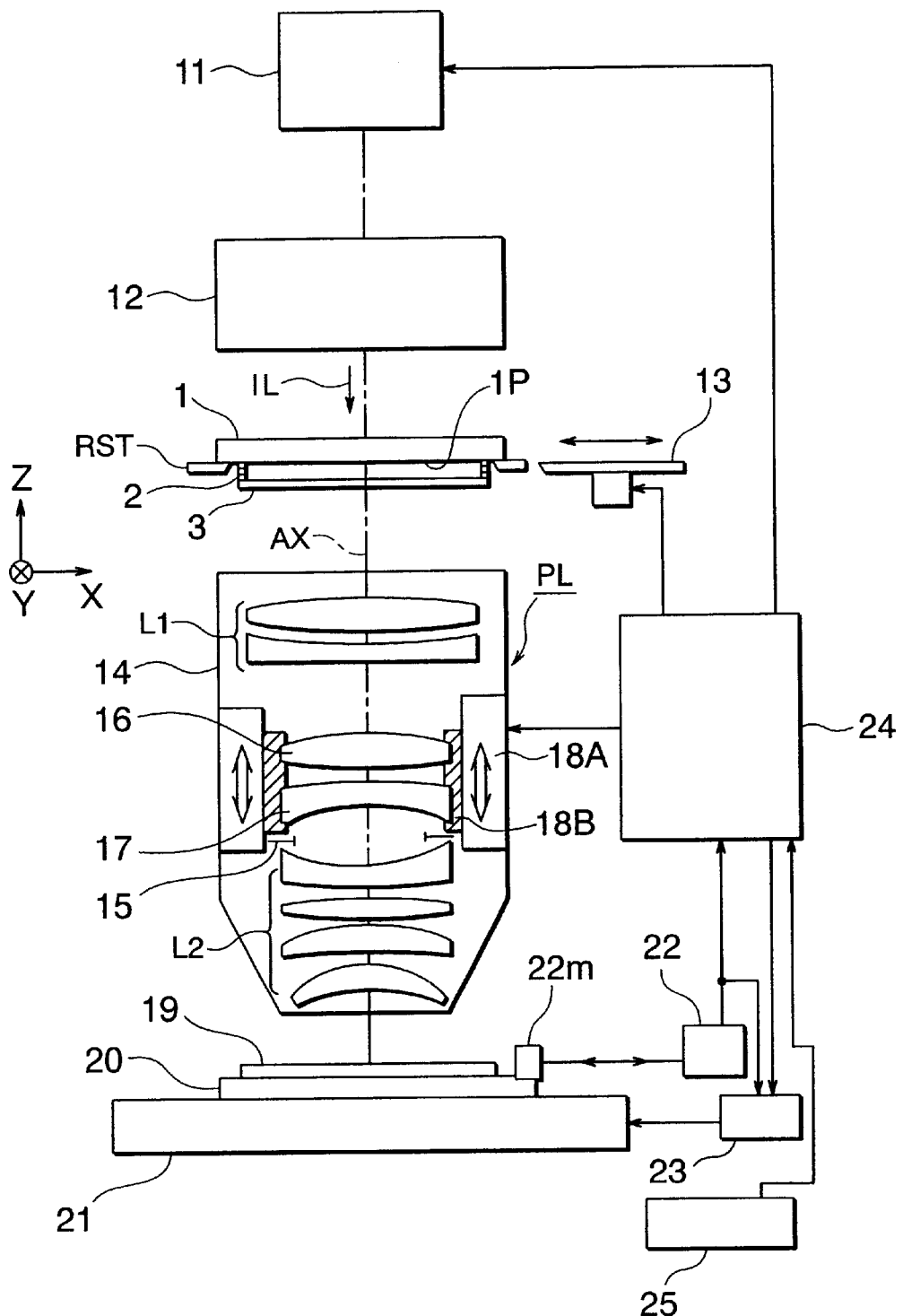
FIG. 7 schematically illustrates the construction of a projection exposure apparatus having a reticle (photomask) according to an embodiment of the present invention.

As shown in FIG. 7, on a reticle stage RST, the reticle 1 shown in FIG. 1 is held by vacuum attraction at its attracting zones 4A and 4B. The plate 3 having transmission to exposure light is disposed on the pattern surface (under surface) 1P of the reticle 1 at a stated interval via the holding frame 2.

Then, at the time of exposure, exposure light IL composed of ultraviolet pulsed light of 157 nm wavelength, emitted from an exposure light source 11 consisting of, e.g., an F$_2$ laser light source, illuminates the pattern region on the pattern surface 1P of the reticle 1 in a uniform illumination distribution via an illumination system 12 having an optical integrator (homogenizer), an aperture strop, a field stop (reticle blind), a condenser lens and so forth. Under the exposure light IL, an image of the pattern in the illumination region of the pattern surface of the reticle 1 is projected on an exposure-target shot region of a wafer 19 coated with a photoresist. The image is projected at a projection magnification β (β is, e.g., ¼ or ⅕) via a projection optical system PL which is telecentric on both sides (or on one side on the wafer side). The projection optical system PL is constituted of a lens system L1, lenses 16 and 17, an aperture stop 15 and a lens system L2 which are disposed in order in a lens barrel 14, from the reticle side to the wafer side. In the following description, a Z-axis is taken in parallel to an optical axis AX of the projection optical system PL, an X-axis is taken in parallel to the paper surface of FIG. 7 in a plane perpendicular to the Z-axis, and a Y-axis is taken in the direction perpendicular to the paper surface of FIG. 7.

First, this reticle 1 is held by attraction on the reticle stage RST, which positions the reticle 1 in the XY plane. The position of the reticle stage RST is measured with a laser interferometer (not shown). Meanwhile, the wafer 19 is held by vacuum attraction on a wafer holder (not shown), and this wafer holder is fixed onto a sample stand 20. The sample stand 20 is placed on an XY stage 21 in the state it is movable in the X-direction and the Y-direction. The position in the XY plane of the sample stand 20 is measured with a moving mirror 22m provided on the sample stand 20 and with a laser interferometer 22. The resultant measured values are fed to a main control system 24 and a wafer stage drive system 23. The wafer stage drive system 23 drives the XY stage 21 in accordance with the measured values fed and control information sent from the main control system 24, and performs the positioning of the sample stand 20. Also, at the bottom of the sample stand 20, incorporated is a focusing mechanism by means of which the surface of the wafer 19 is focused on the image surface of the projection optical system PL by an autofocusing method in accordance with measured values of an autofocus sensor (not shown).

An reticle loader 13 is further disposed in the side direction of the reticle stage RST, and the main control system 24 controls the motion of the reticle loader 13 so that the reticle held on the projection optical system PL can be changed for another. Also, to the main control system 24, a memory unit 25 is connected which is, e.g., a magnetic disk drive in which exposure data are stored which contain information such as the thickness of a transmitting plate (the plate 3 in FIG. 2) for the dustproofing of the reticle to be exposed, the distance between the plate and the reticle pattern surface, and so forth.

The projection exposure apparatus of the present embodiment is of a stepper type (batch exposure type), and hence, after exposure is completed on one shot region on the wafer 19, the sample stand 20 is stepwise moved via the XY stage 21, whereby the next shot region on the wafer 19 is moved to the region exposed by means of the projection optical system PL, thus the motion to expose the pattern image of the reticle 1 is repeated.

Now, as in the reticle 1 of the present embodiment, where the dustproof-purpose transmitting plate 3 having a larger thickness than conventional pellicles is disposed in the course of imaging light rays, i.e., the course extending from the pattern surface 1P to the wafer 19, aberrations may occur in the projected image however the plate 3 has an ideal smoothness. In the case when the projection optical system PL is what is called the both-side telecentric imaging optical system, commonly available at present, the aberration caused by the thick plate 3 may only be spherical aberration. However, in the case when the projection optical system PL is an optical system which is not telecentric on the reticle side, astigmatism and coma aberration may further occur at surrounding positions of the image.

Accordingly, the projection exposure apparatus of the present embodiment is so made up as to correct aberrations previously in the stage of designing the projection optical system PL, including the thick transmitting plate 3. This enables formation of accurate pattern images on the wafer 19 even where the plate 3 is provided in the course of the imaging optical path as in the reticle 1 of the present embodiment. In this regard, there is a possibility that the thickness of the transmitting plate 3 used in the reticle 1 of the present embodiment varies more or less because of manufacture errors in the manufacture of the plate. Such variations in thickness may cause changes in the level of the aberrations that may be caused by the plate 3. To deal with such changes in the level of aberrations, the lenses 16 and 17 as optical members constituting part of the projection optical system PL of the present embodiment are so constructed that they are slightly movable in the direction of the optical axis AX. More specifically, the lenses 16 and 17 are set stationary in a lens frame 18B, the lens frame 18B is held inside an up-and-down mechanism 18A, and the up-and-down mechanism 18A is set stationary in the lens barrel 14. The up-and-down mechanism 18A and the lens frame 18B make up an imaging conditioning mechanism, where the up-and-down mechanism 18A slightly moves the lens frame 18B in the direction of the optical axis AX (in the direction of Z) by, e.g., a feed screw method, in accordance with control information sent from the main control system 24.

Every time the reticle on the reticle stage RST is changed for another via the reticle loader 13, the main control system 24 reads the thickness h of the dustproof-purpose transmitting plate 3 (the plate 3 in FIG. 3) disposed above the pattern surface of the reticle to be just being exposed; the thickness being read from an exposure data file recorded in the memory unit 25. Then, the extent of drive of the lens frame 18B (lenses 16 and 17) for cancelling the level of changes in aberration of the projection optical system PL which are caused by this thickness h is determined, and the information on this extent of drive is sent out to the up-and-down mechanism 18A. Thus, the position of the lenses 16 and 17 in the direction of Z is adjusted and ideal imaging characteristics are maintained.

The optical condition to be adjusted here is chiefly the spherical aberration. Hence, when the spherical aberration is controlled, it is preferable to adjust the position of an optical member provided in the vicinity of the aperture stop 15 positioned at the pupil surface of the projection optical system PL. Accordingly, in the present embodiment, the lenses 16 and 17 in the vicinity of the aperture stop 15 are so set as to be slightly movable. Thus, in the present embodiment, the imaging characteristics of the projection optical system PL are corrected in accordance with the thickness h of the transmitting plate 3 for dustproofing, and hence, even when there is a scattering in the thickness h of the plate, the image of the pattern of the reticle can be transferred onto the wafer in a high precision.

Incidentally, when other astigmatism, coma aberration and so forth should also be corrected, a drive mechanism for the corresponding optical members may be provided. In addition, when there is also a scattering in the interval between the pattern surface of the reticle 1 and its plate 3, such an interval may be taken into account to determine the extent of correction of imaging characteristics.

[Projection Optical System]

Figure 8:
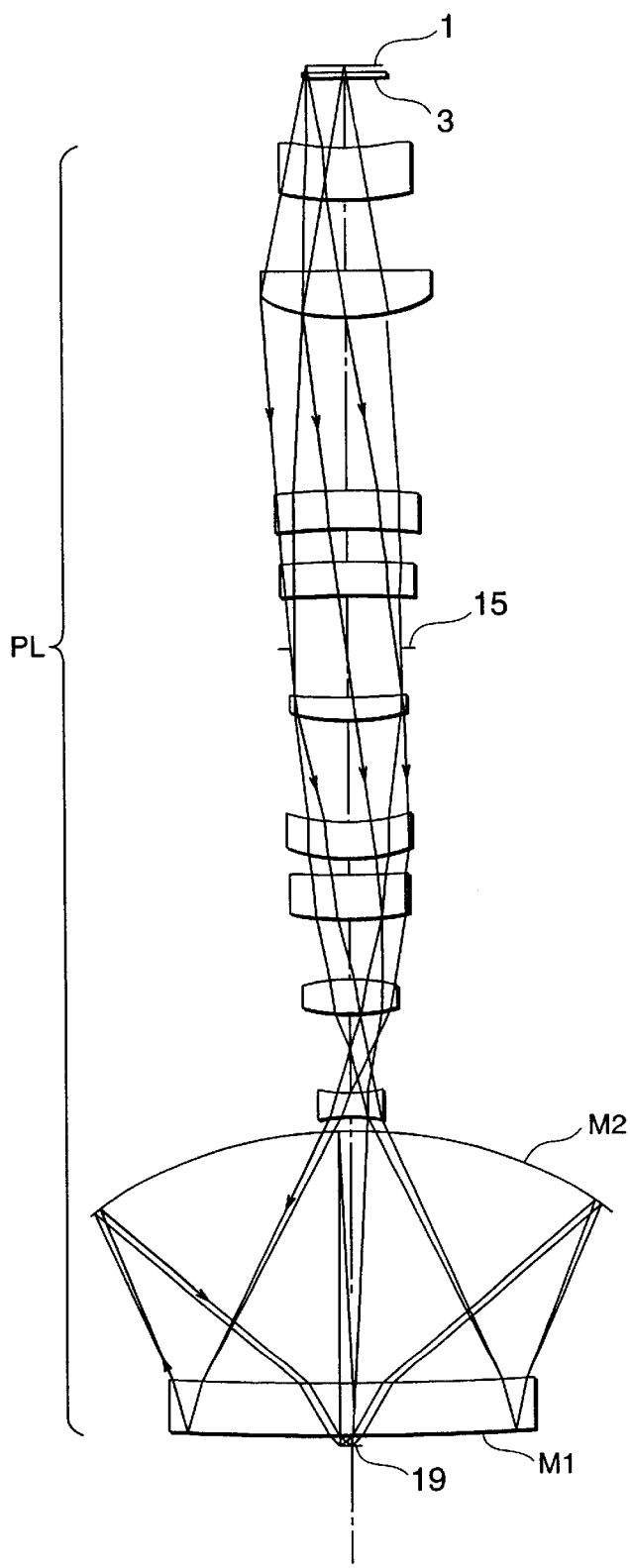
FIG. 8 illustrates the lens construction of a projection optical system having a reticle (photomask) according to an embodiment of the present invention.

A numerical example of the projection optical system PL, preferable for the projection exposure apparatus described above, is described below. FIG. 8 illustrates the lens construction of a projection optical system designed taking account of the thickness of the transmitting plate 3. This projection optical system is a catadioptric optical system having reflection surfaces M1 and M2. Its factorial values are given below in Table 3. Letter symbol NA in the whole factorial values indicates the numerical aperture on the wafer side; and "Image circle", the radius of the exposure region. In the lens data, the first column shows lens surface number counted from the object side; the second column r, curvature radius of lens surface; and the third column d, lens surface interval. Also, in the column of aspheric coefficient, shown are aspheric coefficients obtained when the aspheric surface is represented by the following expression.

$$Z=(1/r)\cdot y^2/[1+(1-(+K)(1/r)^2 y^2)^{1/2}]+A\cdot Y^4+B\cdot Y^6+C\cdot Y^8+D\cdot Y^{10}+E\cdot Y^{12}+F\cdot Y^{14}+G\cdot Y^{16},$$

where Z is distance along the optical axis extending from a tangential plane at an apex of the aspheric surface to a position on the aspheric surface at a height Y.

TABLE 3

(Factorial values)
NA: 0.75
magnification: ¼
image circle (radius): 8.2 mm
wavelength of exposure light: 157.6 nm

| (Lens data) | | | |
|---|---|---|---|
| surface number | r | d | glass |
| object plane | ∞(plane) | 5.5001 | |
| 1 | ∞(plane) | 5.0000 | thin plate glass fluorite |
| 2 | ∞(plane) | 60.7949 | |
| 3 | −281.1116 | 45.0000 | aspheric surface1 fluorite |

TABLE 3-continued

| | | | | |
|---|---|---|---|---|
| 4 | −299.5002 | 63.9789 | | |
| 5 | −1017.4868 | 40.0000 | | fluorite |
| 6 | −150.0000 | 153.5525 | aspheric surface2 | |
| 7 | 275.1888 | 35.0000 | aspheric surface3 | fluorite |
| 8 | 635.6006 | 28.2119 | | |
| 9 | 331.5373 | 29.9668 | aspheric surface4 | fluorite |
| 10 | 732.4869 | 49.5117 | | |
| 11 | ∞(plane) | 41.7982 | aperture stop | |
| 12 | −561.5812 | 20.0000 | | fluorite |
| 13 | −135.2503 | 91.7743 | aspheric surface5 | |
| 14 | −136.1220 | 32.1863 | aspheric surface6 | fluorite |
| 15 | −137.1607 | 14.4013 | | |
| 16 | 1971.3346 | 39.9997 | aspheric surface7 | fluorite |
| 17 | −231.1087 | 53.7569 | | |
| 18 | 198.2050 | 30.0000 | aspheric surface8 | fluorite |
| 19 | −122.9848 | 69.9165 | | |
| 20 | −117.1135 | 20.0000 | | fluorite |
| 21 | 137.7481 | 10.0000 | | |
| 22 | 366.9033 | 223.1538 | | |
| 23 | −2851.2448 | 45.0000 | | fluorite |
| 24 | −3642.8842 | −45.0000 | rear surface reflecting surface | fluorite |
| 25 | −2851.2448 | −223.1538 | primary mirror | |
| 26 | 366.9033 | 223.1538 | | fluorite |
| 27 | −2851.2448 | 45.0000 | | |
| 28 | −3642.8842 | 10.0172 | | |
| imaging plane | ∞(plane) | 0.0000 | | |

(Aspheric surface data)

aspheric surface1
K = 0.00000   A = −7.15887 × $10^{-8}$   B = −8.48641 × $10^{-10}$
C = −9.73476 × $10^{-12}$   D = +3.78058 × $10^{-19}$   E = −3.12830 × $10^{-22}$
F = +9.84470 × $10^{-26}$   G = −1.26344 × $10^{-29}$ aspheric surface2
K = 0.00000   A = −1.35485 × $10^{-8}$   B = −1.43420 × $10^{-13}$
C = +6.02671 × $10^{-17}$   D = −3.53546 × $10^{-22}$   E = −1.03079 × $10^{-24}$
F = +1.82784 × $10^{-28}$   G = −1.08066 × $10^{-32}$ aspheric surface3
K = 0.00000   A = −9.50000 × $10^{-8}$   B = −1.55999 × $10^{-11}$
C = −9.69543 × $10^{-16}$   D = −6.43188 × $10^{-20}$   E = −8.86774 × $10^{-24}$
F = +1.20208 × $10^{-27}$   G = −8.46122 × $10^{-32}$ aspheric surface4
K = 0.00000   A = −8.08174 × $10^{-8}$   B = +1.99825 × $10^{-11}$
C = +1.75597 × $10^{-15}$   D = −1.77830 × $10^{-20}$   E = −1.15003 × $10^{-23}$
F = −2.69584 × $10{-27}$   G = +3.13958 × $10^{-31}$ aspheric surface5
K = 0.00000   A = +1.66877 × $10^{-7}$   B = +1.28916 × $10^{-11}$
C = +1.93761 × $10^{-15}$   D = −1.17318 × $10^{-19}$   E = −1.50670 × $10^{-22}$
F = −3.70935 × $10^{-26}$   G = +9.78834 × $10^{-30}$ aspheric surface6
K = 0.00000   A = +3.49959 × $10^{-8}$   B = +2.05934 × $10^{-11}$
C = +3.48613 × $10^{-15}$   D = +1.27207 × $10^{-20}$   E = −1.14309 × $10^{-23}$
F = +1.82360 × $10^{-27}$   G = −3.50697 × $10^{-31}$ aspheric surface7
K = 0.00000   A = −2.43196 × $10^{-7}$   B = −2.52149 × $10^{-11}$
C = −3.61577 × $10^{-15}$   D = −3.80628 × $10^{-19}$   E = −1.87774 × $10^{-22}$
F = +3.81208 × $10^{-26}$   G = −1.36952 × $10^{-29}$ aspheric surface8
K = 0.00000   A = −1.55943 × $10^{-7}$   B = −7.21850 × $10^{-13}$
C = +1.28734 × $10^{-16}$   D = +8.98585 × $10^{-20}$   E = −2.31981 × $10^{-22}$
F = +1.70210 × $10^{-25}$   G = −4.28404 × $10^{-29}$ FIG. 9 shows transverse aberrations of the projection optical system. As can also be seen from the drawing, aberrations are kept corrected well even when the reticle 1 having the transmitting plate 3 as described in the above embodiments is used.

Incidentally, as the projection optical system, also usable in addition to those according to the above embodiments are, e.g., catadioptric projection optical systems disclosed in Japanese Patent Applications Laid-open No. 11-354436 and No. 8-63502 and dioptric projection optical systems disclosed in WO99/25008.

(Surface Working of Photomask)

A procedure of working the transmitting plate 3 in order to correct the distortion in the reticle of the embodiments as described above is described below. The surface working of the transmitting plate 3 is described on two cases, in which (A) it is carried out in combination of the reticle (mask) with the projection optical system and (B) it is carried on the reticle (mask) alone.

[(A) Procedure of Correcting Distortion in Combination of Reticle (Mask) With Projection Optical System]

Figure 10A:
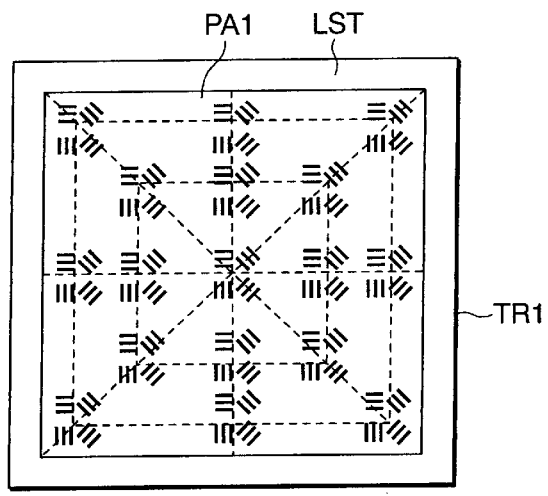
FIG. 10A, FIG. 10B and FIG. 10C illustrate an example of a test reticle, another example of the test reticle, and the state of a pattern on wafer which has been formed using the test reticle, respectively.

In the first place, before random components of the distortion are corrected, symmetric components among various aberrations of the projection objective lens PL are corrected. First, the test reticle TR1 having a stated pattern formed thereon is placed on the reticle stage RST. This test reticle TR1 has, e.g., as shown in FIG. 10A, a pattern region PA1 and a light-screening band LST which surrounds this pattern region PA1. Then, though not shown in FIG. 10A, the transmitting plate disposed apart by a stated interval from the pattern region PA1 is provided on the test reticle TR1. Incidentally, this transmitting plate has a known thickness and a known figure (surface shape). Here, the transmitting plate has the same thickness as the thickness of the transmitting plate 3 provided on the reticle used actually. Next, the test reticle TR1 is subjected to Koehler illumination by the exposure light of the illumination system 12. The light coming from the test reticle TR1 thus illuminated reaches the wafer 19 coated with a photosensitive material such as a resist, through the transmitting plate 3 and the projection objective lens PL to form on the wafer 19 a pattern image of the test reticle TR1. Thereafter, the wafer 19 is subjected to development, and a resist pattern image formed by this development is measured with a coordinate measuring instrument. Thereafter, the adjustment of intervals of optical members and the adjustment of tilt-shift of the optical members are made in accordance with the information of the resist pattern image thus measured, to correct aberrations other than the random components of distortion.

Incidentally, in the correction of aberrations, it is preferable to take account of the aberration caused by the figure (surface form) of the transmitting plate (not shown) provided on the test reticle TR1.

Figure 10B:
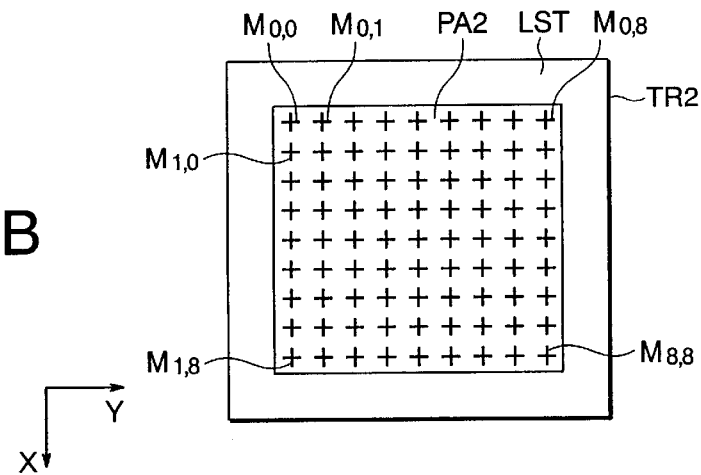

After the aberrations other than the random components of distortion have been corrected, the random components of distortion are corrected. First, in place of the test reticle TR1 used for the above correction, a test reticle TR2 as shown in FIG. 10B is placed on the reticle stage RST. This test reticle TR2 has a plurality of cross marks $M_{0,0}$ to $M_{8,8}$ arranged in matrix, i.e., arranged on lattice points of a square lattice, in a pattern region PA2 surrounded by the light-screening band LST for screening the exposure light, and is, like the test reticle TR1, provided with a transmitting plate disposed apart by a stated interval from the pattern region PA2. The transmitting plate of the test reticle TR2 also has a known thickness and a known figure (surface shape), and also the transmitting plate has the same thickness as the thickness of the transmitting plate 3 provided on the reticle used actually. Incidentally, the cross marks $M_{0,0}$ to $M_{8,8}$ of the test reticle TR2 may also be provided on the pattern region PA1 of the reticle TR1, i.e., the reticle TR1 and the test reticle TR2 may be used in common.

Next, referring back to FIG. 7, the test reticle TR2 on the reticle stage RST is illuminated by exposure light of the illumination system 12. The light coming from the test reticle TR2 thus illuminated reaches the exposure region of the wafer 19 coated with a photosensitive material such as a resist on its surface, through the transmitting plate 3 and the projection objective lens PL to form on the wafer 19 a pattern image (latent image) corresponding to the cross marks $M_{0,0}$ to $M_{8,8}$ of the test reticle TR2. Thereafter, the wafer 19 is subjected to development to make into a pattern the cross marks $M_{0,0}$ to $M_{8,8}$ thus exposed.

Figure 10C:
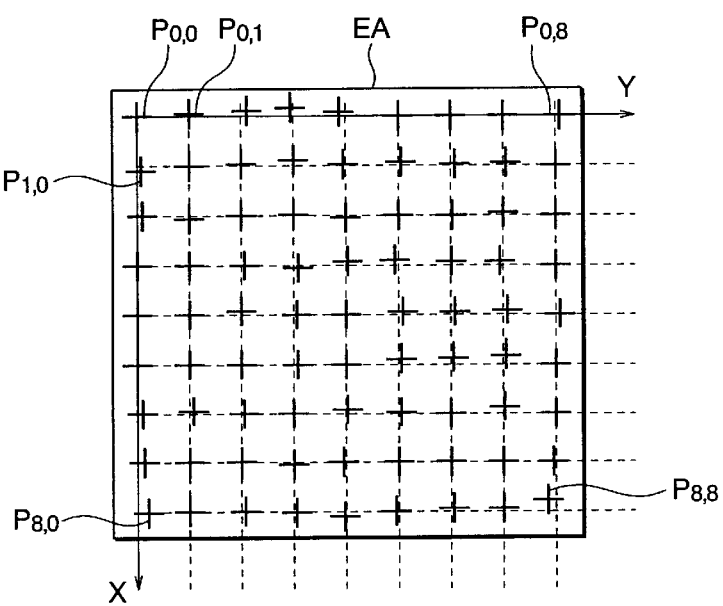

The cross marks made into a pattern in the exposure region EA on the wafer 19 are shown in FIG. 10C. Incidentally, in FIG. 10C, ideal imaging positions which are imaging positions when the projection optical system is an ideal optical system (aberration-free optical system) are indicated by dotted-line intersection points. In FIG. 10C, what corresponds to the image of a cross mark $M_{0,0}$ on the reticle 1 is a cross pattern element $P_{0,0}$, what corresponds to the image of a cross mark M1,0 on the reticle 1 is a cross pattern element $P_{1,0}$, what corresponds to the image of a cross mark $M_{8,8}$ on the reticle 1 is a cross pattern element $P_{8,8}$, and the subsequent cross marks and cross pattern elements correspond likewise.

Thereafter, respective XY coordinates of the cross pattern elements $P_{0,0}$ to $P_{8,8}$ formed on the wafer 19 are measured with a coordinate measuring instrument. In the present embodiment, light rays coming from the cross marks $M_{0,0}$ to $M_{8,8}$ collected on the cross pattern elements $P_{0,0}$ to $P_{8,8}$ respectively, are displaced to ideal imaging positions of the cross pattern elements $P_{0,0}$ to $P_{8,8}$ by working the figure (surface form) of the transmitting plate 3. In the following, how to specifically calculate the figure (surface form) of the transmitting plate 3 is described.

As shown in FIG. 7, the transmitting plate 3 is disposed in the course of the optical path extending between the projection objective lens PL and the reticle 1. This position is a position where light rays having a relatively slender numerical aperture (N.A.) pass. Accordingly, when the imaging positions are displaced by means of the transmitting plate 3, the displacement of the principal ray among light rays displaced by changing the figure (surface form) of the transmitting plate 3 may typically be taken into account.

Here, where an extent of distortion which is the extent of deviation of the cross pattern elements $P_{0,0}$ to $PM_{8,8}$ from the ideal imaging positions shown in FIG. 10C is represented by w, and an extent of change in angles of normals on the surface of the transmitting plate 3 at principal-ray pass points which are the points where the principal rays coming from the cross marks $M_{0,0}$ to $M_{8,8}$ pass the transmitting plate 3 is represented by θ, the following is established.

$$w = \beta \cdot L_R (n-1) \cdot \theta \quad (16)$$

In the above, the extent of change in angles, θ, concerns the normals of the transmitting plate 3 surface standing as a reference before working; β is transverse magnification of the projection optical system; $L_R$ is distance along the optical-axis direction, between the reticle 1 and the transmitting plate 3 surface to be worked; and n is refractive index of the transmitting plate 3. Also, in the expression (16), the transmitting plate 3 surface to be worked is set to be the surface on the wafer 19 side.

Thus, surface normals at the principal-ray pass points of the transmitting plate 3 surface can be determined from the above coordinates of the cross pattern elements $P_{0,0}$ to $P_{8,8}$ as measured with a coordinate measuring instrument, and from the extent of distortion which is the extent of deviation from the ideal imaging positions. This can settle the surface normals of the transmitting plate 3 at the respective principal-ray pass points, but the surface of the transmitting plate 3 can not be in a continuously connected form. Hence, in the following procedure, it is made into a continuously connected surface form by the use of a curved-surface interpolation formula on the basis of the surface normals at the principal-ray pass points.

Figure 11A:
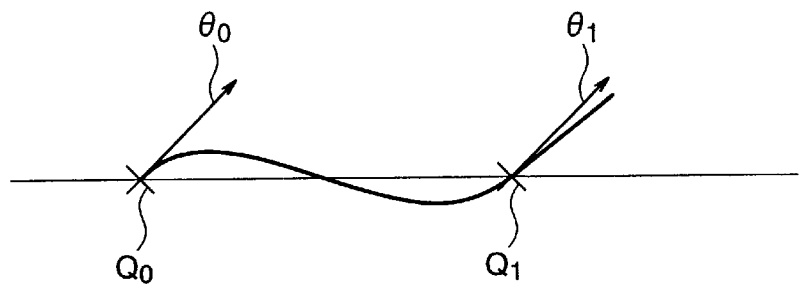
FIG. 11A shows an instance in which a conventional curved-surface interpolation formula.

Here, various types are available as the interpolation formula. As an interpolation formula used in the present embodiment, the one according to the Coons formula which interpolates curved surfaces on the basis of coordinates of points and tangential vectors at the coordinates is preferred because surface normals are known and the tangential vectors of the surface at the principal-ray pass points can be determined from the surface normals. However, where as shown in FIG. 11A tangential vectors $\theta_0$ and $\theta_1$ at coordinates adjoining each other at points $Q_0$ and $Q_1$ are both equal for example, curved lines (curved surfaces) to be interpolated may undulate. Such a problem may occur.

In the present embodiment, where distortions caused by principal rays passing the principal-ray pass points adjoining each other are in an equal extent, it is effective to make equal the extent of distortion also between these principal-ray pass points adjoining each other. Here, where the curved lines (curved surfaces) to be interpolated undulate as shown in FIG. 11A, the extent and direction of distortion between the principal-ray pass points adjoining each other may change one after another. Thus, there is a possibility that not only the random components of distortion can not be corrected but also any additional random components of distortion may be caused between measuring points.

Figure 11B:
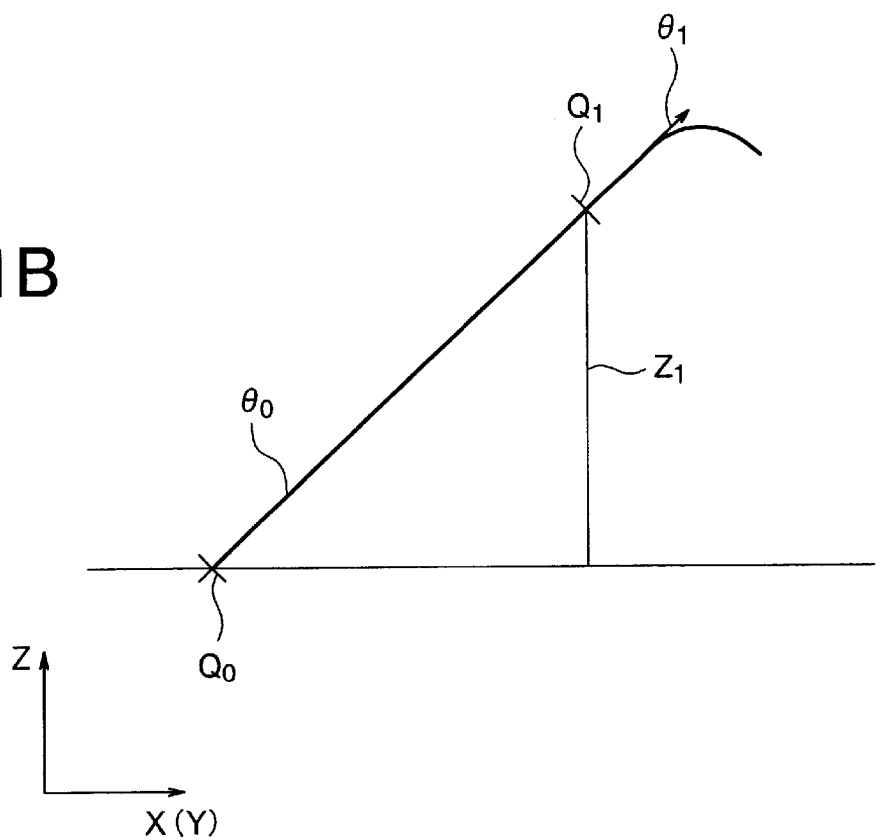
FIG. 11B shows an instance in which a curved-surface interpolation formula according to the present embodiments.

Accordingly, in the present embodiment, in order to make the extent of distortion equal between the principal-ray pass points adjoining each other, too, as shown in FIG. 11B a vector component in the direction of Z of the tangential vector $\theta_0$ at the coordinate $Q_0$ is added to the coordinate $Q_1$ adjoining to the coordinate Q0, as a height Z1 in the direction of Z. Thus, even where the tangential vectors at the coordinates $Q_0$ and $Q_1$ adjoining each other are both equal, the curve to be interpolated can substantially be straight-line between these coordinates $Q_0$ and Q1, and the principal ray which passes between these coordinates $Q_0$ and $Q_1$ is refracted at substantially equal angles. Hence, where the distortions caused by principal rays passing the principal-ray pass points adjoining each other are in an equal extent, the extent of distortion can be made equal between these principal-ray pass points adjoining each other, too.

The procedure of curved-surface interpolation in the present embodiment is specifically described below with reference to FIGS. 12A to 12E. Incidentally, in FIGS. 12A to 12E, the XYZ coordinate system is employed.

[Step 1]

Figure 12A:
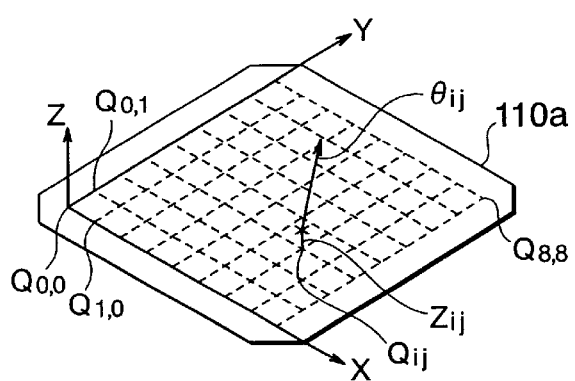
FIGS. 12A to 12E illustrate a method of curved-surface interpolation according to the present embodiments.

First, as shown in FIG. 12A, XYZ coordinates are taken on the surface to be worked 110a of the transmitting plate 3. Incidentally, in FIG. 12A, the principal-ray pass points $Q_0$ and $Q_1$ at which the principal rays going ahead to the cross pattern elements $P_{0,0}$ to $P_{8,8}$ shown in FIG. 12B from the cross marks $M_{0,0}$ to $M_{8,8}$ shown in FIG. 10B pass the transmitting plate 3 are shown by dotted-line cross points. Here, normal vectors at the respective principal-ray pass points $Q_0$ and $Q_1$ determined according to the above expression (16) are indicated as $\theta_{i,j}$ (where, in the present embodiment, i=0 to 8, j=0 to 8, i.e., $\theta_{0,0}$ to $\theta_{8,8}$), and heights in the direction of Z at the respective principal-ray pass points $Q_{0,0}$ and $Q_{8,8}$ are indicated as $Z_{i,j}$ (where, in the present embodiment, i=0 to 8, j=0 to 8, i.e., $Z_{0,0}$ and $Z_{8,8}$).

[Step 2]

Figure 12D:
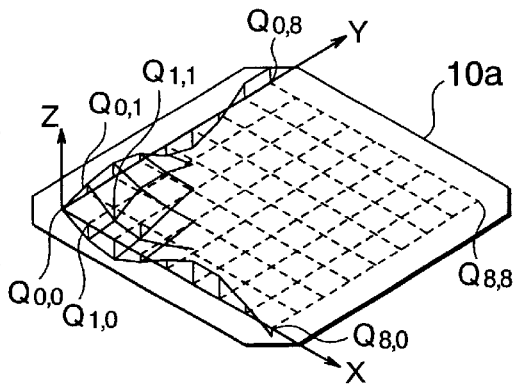
Figure 12B:
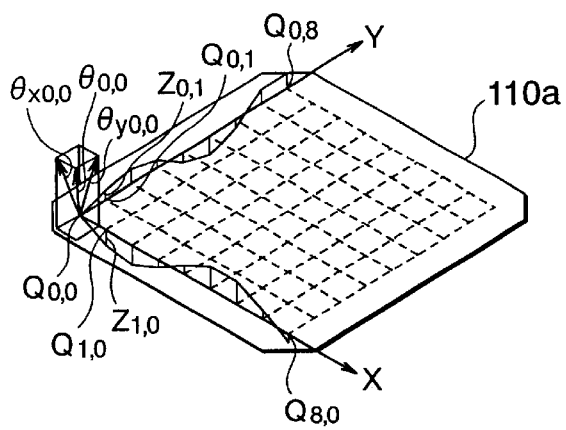

Next, as shown in FIG. 12B, a principal-ray pass point $Q_{0,0}$ which is the extreme point on the Y-axis among the principal-ray pass points is regarded as $Z_{0,0}=0$ as a base in the Z-axis direction.

[Step 3]

On the basis of the normal vector $\theta_{0,0}$ of the principal-ray pass point $Q_{0,0}$, height $Z_{0,1}$ in the direction of Z at a principal-ray pass point $Q_{0,1}$ of the coordinate adjoining to the principal-ray pass point $Q_{0,0}$ on the Y-axis is calculated according to the following expression.

$$Z_{0,1}=Z_{0,j-1}+\theta y_{0,j-1}(y_{0,j}-y_{0,j-1}) \quad (17)$$

where;

$\theta y_{0,j}$: a vector component of the Y-axis direction of a normal vector $\theta_{0,j}$ at a principal-ray pass point $Q_{0,j}$; and $y_{0,1}$: a component of the Y-axis direction of a coordinate value obtained when the principal-ray pass point $Q_{0,0}$ at the principal-ray pass point $Q_{0,j}$ is taken as an original.

In this step 3, the height $Z_{0,1}$ in the direction of Z at the principal-ray pass point $Q_{0,1}$ is calculated on the basis of the above formula (17), according to:

$$Z_{0,1}=Z_{0,0}+\theta y_{0,0}(y_{0,1}-y_{0,0}).$$

[Step 4]

On the basis of the above formula (17), heights Z0,2 to Z0,8 in the direction of Z are calculated in respect of principal-ray pass points Q0,2 to Q0,8 on the Y-axis.

[Step 5]

On the basis of the normal vector $\theta_{0,0}$ of the principal-ray pass point $Q_{0,0}$, height $Z_{1,0}$ in the direction of Z at a principal-ray pass point $Q_{1,0}$ of the coordinate adjoining to the principal-ray pass point $Q_{0,0}$ on the X-axis is calculated according to the following expression (18).

$$Z_{i,0}=Z_{i-1,0}+\theta x_{i-1,0}(x_{i,0}-x_{i-1,0}) \quad (18)$$

where;

$\theta x_{i,0}$: a vector component of the X-axis direction of a normal vector $\theta i,0$ at a principal-ray pass point $Q_{i,0}$; and $x_{i,0}$: a component of the X-axis direction of a coordinate value obtained when the principal-ray pass point $Q_{0,0}$ at the principal-ray pass point $Q_{i,0}$ is taken as an original.

In this step 5, the height $Z_{1,0}$ in the direction of Z at the principal-ray pass point $Q_{1,0}$ is calculated on the basis of the above formula (18), according to:

$$Z_{1,0}=Z_{0,0}+\theta x_{0,0}(x_{1,0}-x_{0,0}).$$

[Step 6]

On the basis of the above formula (18), heights $Z_{2,0}$ to $Z_{8,0}$ in the direction of Z are calculated in respect of principal-ray pass points $Q_{2,0}$ to $Q_{8,0}$ on the X-axis.

[Step 7]

Figure 12E:
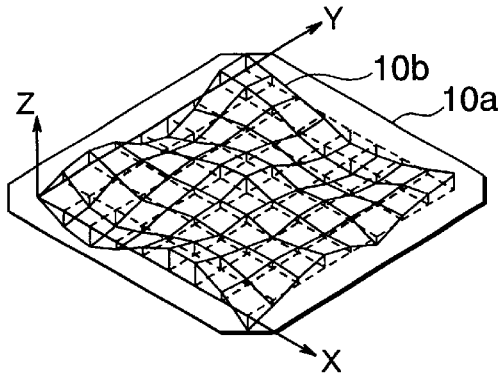
Figure 12C:
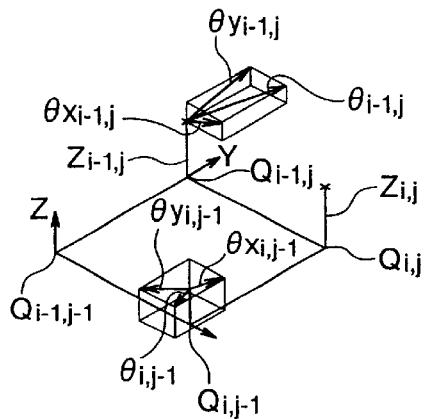

As shown in FIG. 12C, height $Z_{i,j}$ in the direction of Z each in the order close to the original $Q_{0,0}$ among principal-ray pass points $Q_{1,1}$ to $Q_{8,8}$ held between the X-axis and Y-axis is calculated according to the following expression (19).

$$\{[Z_{i-1,j}+\theta x_{i-1,j}(x_{i,j}-x_{i-1,j})]+[Z_{i,j-1}\theta y_{i,j-1}(y_{i,j}-x_{i,j-1})]\}2 \quad (19)$$

In the step 7, first the height $Z_{1,1}$ in the direction of Z at the principal-ray pass point $Q_{1,1}$ which is closest to the original $Q_{0,0}$ is determined. Here, the height $Z_{1,1}$ in the direction of Z at the principal-ray pass point $Q_{1,1}$ is calculated on the basis of the above formula (19), according to:

$$Z_{1,1}=\{[Z_{0,1}+\theta x_{0,1}(x1,1-x_{0,1})]+[Z_{1,0}+\theta y_{1,0}(y1,1-y_{1,0})]\}/2.$$

In the step 7, as shown in FIG. 12D, after the height $Z_{1,1}$ in the direction of Z at the principal-ray pass point $Q_{1,1}$ has been calculated, $Z_{1,2}, Z_{2,1}, Z_{2,2} \ldots Z_{8,8}$ in the direction of Z at principal-ray pass points $Q_{1,2}, Q_{2,1}, Q_{2,2} \ldots Q_{i,j} \ldots Q_{8,8}$ are calculated in the order close to the original $Q_{0,0}$ according to the above expression (19).

[Step 8]

On the bases of i) the $Z_{0,0}$ to $Z_{8,8}$ at the principal-ray pass points $Q_{0,0}$ to $Q_{8,8}$, determined in the above steps 1 to 7, ii) the XY coordinates of the principal-ray pass points $Q_{0,0}$ to $Q_{8,8}$ and iii) the tangential vectors at the principal-ray pass points $Q_{0,0}$ to $Q_{8,8}$, determined from the surface normal vectors $\theta_{0,0}$ to $\theta_{8,8}$ at the principal-ray pass points $Q_{0,0}$ to $Q_{8,8}$, the curved surface is spanned by the Qoons-Patch's method. More specifically, Qoons-Patch's control points are regarded as the XYZ coordinates at the principal-ray pass points $Q_{0,0}$ to $Q_{8,8}$, and their tangential vectors are regarded as the tangential vectors determined from the surface normal vectors $\theta_{0,0}$ to $\theta_{8,8}$ at the principal-ray pass points ($Q_{0,0}$ to $Q_{8,8}$.

By the curved-surface interpolation according to the Qoons-Patch's method in this step 8, a curved surface as shown in, e.g., FIG. 12E can be obtained. Incidentally, in the above steps 1 to 8, base lines in the XY directions, obtained in the steps 3 to 6, are set on the X-axis and Y-axis. Alternatively, these may be so set that the base lines in the XY directions pass the optical axis. In such a case, the following step A may be executed between the above steps 6 and 7.

[Step A]

An offset in the direction of Z is put on the Y-axis and X-axis at the height in the direction of Z at their principal-ray pass points, calculated in the above steps 3 and 6, in such a way that the height in the direction of Z at the point the optical axis passes comes to be 0.

Where the measuring points of distortion, i.e., the marks on the test reticle are not arranged on the lattice points of the square lattice, the height in the direction of Z and surface normal vectors at the lattice points of a square lattice which correspond to medium points of the respective measuring points are interpolated. Stated specifically, the height in the direction of Z and surface normal vectors at the measuring points of distortion which surround the lattice points of the square lattice at which the height in the direction of Z and surface normal vectors are to be determined may be multiplied by the distance, calculated as weight, extending from the measuring points of distortion to the lattice points of the square lattice.

Incidentally, in the steps 1 to 8 described above, only the information on the inside of the measuring points of distortion is used. In order to make the transmitting plate 3 have a smoother figure (surface form) as a member to be worked, the lattice points maybe taken on the outside of principal-ray pass points present on the outermost side (the side standing apart from the optical axis) among the principal-ray pass points corresponding to the measuring points of distortion, and height in the direction of Z and surface normal vectors at such measuring points may be interpolated from height in the direction of Z and surface normal vectors at the principal-ray pass points present on the outermost side.

Where the transmitting plate of the test reticle TR2 used at the time of measurement has an ideal figure (surface form), the figure (surface form) for correcting the extent of distortion measured as described above may be imparted to the transmitting plate 3 of the reticle used actually. However, where the transmitting plate of the test reticle TR2 has not any ideal figure (surface form), the distortion ascribable to errors in figure (surface form) of the transmitting plate of the test reticle TR2 adds to the distortion measured as an offset. Accordingly, it is preferable to regard as a known factor the errors in figure (surface form) of the transmitting plate of the test reticle and to subtract from the measured distortion the distortion ascribable to the errors in figure (surface form) of the transmitting plate of the test reticle TR2.

Figure 13:
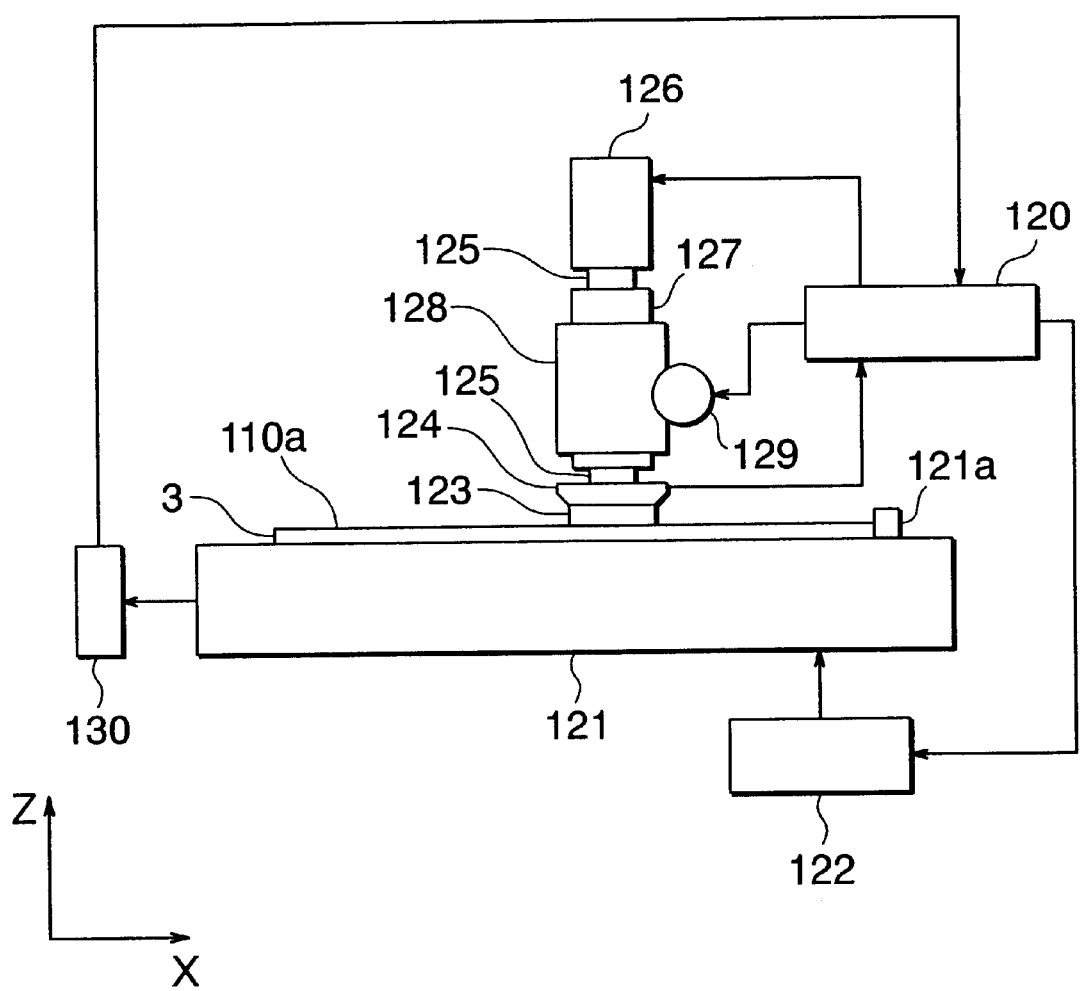
FIG. 13 illustrates the construction of an apparatus for working the transmitting plate.

Next, the reticle 1 having the transmitting plate 3 is detached from the projection optical apparatus shown in FIG. 7, and the surface of the transmitting plate 3 thus detached is worked in accordance with the data of figure (surf ace form) of the transmitting plate 3, obtained through the steps 1 to 8. Here, since the random components of distortion are corrected, the transmitting plate 3 in the present embodiment has a figure (surface form) which is random and undulates irregularly. Accordingly, in the present embodiment, a polishing apparatus as shown in FIG. 13 is used. Incidentally, the apparatus shown in FIG. 13 employs the XZ coordinate system.

In FIG. 13, the transmitting plate 3 is placed on a stage 121 movable in the XY directions, and its one end comes in contact with a pin 121a provided on the stage 121. Also, a drive unit 122 which makes the stage 121 move over the XY directions is controlled by a control unit 120. In order to detect the position of the stage 121 in the XY directions when it is moved by means of the drive unit 122, the stage 121 is provided with a detector unit consisting of an encoder, an interferometer and so forth. Signals of detection by this detector unit 130 are sent to the control unit 120.

A polishing tray 123 is also attached to one end of a rotating shaft 125 via a holder 124, and is rotatable around a shaft standing in the direction of Z in the drawing. To the other end of this rotating shaft 125, a motor 126 is attached which is controlled by the control unit 120. A bearing 127 which supports the rotating shaft 125 rotatably is so provided as to be movable in the direction of Z with respect to a supporting section 128 fixed to the main body (not shown). To this supporting section 120, a motor 129 is attached which is controlled by the control unit 120. The bearing 127 moves over the direction of Z by the action of this motor, and besides the polishing tray 123 moves over the direction of Z. Here, the holder 124 which holds the polishing tray 123 is provided with a sensor (not shown) for detecting the pressure of contact between the polishing tray 123 and the transmitting plate 3, and outputs from this sensor are sent to the control unit 120.

Next, to briefly describe the motion of the polishing apparatus shown in FIG. 13, first, the figure (surface form) data obtained through the steps 1 to 8 described above are inputted to the control unit 120. Thereafter, the control unit 120 makes the stage 121 to move over the XY directions via the drive unit while making the polishing tray 123 rotate. More specifically, the polishing tray 123 moves in such a way that it follows the working surface 110a of the transmitting plate 3 over the XY directions. Here, the amount of polishing at the working surface 110a of the transmitting plate 3 depends on the pressure of contact between the working surface 110a and the polishing tray 123 and on the residence time of the polishing tray 123.

Thereafter, the transmitting plate 3 thus worked by means of the polishing apparatus shown in FIG. 13 is subjected to vacuum deposition to form an antireflection film thereon, and the reticle 1, having the transmitting plate 3 thus worked, is placed on the reticle stage RST of the projection optical apparatus shown in FIG. 7.

Incidentally, the polishing tray 123, which is fixed in the XY directions in the polishing apparatus shown in FIG. 13, may be made to move while the stage 121 is made to move in the XY directions.

Incidentally, what has been described in the foregoing is the correction of random components of distortion. This method is not limited to the correction of random components of distortion, and is applicable to the correction of asymmetric aberration.

In the foregoing embodiment, the transmitting plate is provided on the test reticles TR1 and TR2. This transmitting plate, however, may be omitted. In such a case, as in an embodiment shown in FIGS. 15A and 15B, described later, the pattern-formed region PA1 or PA2 of the test reticle TR1 or TR2 may be displaced from the reference surface in the direction of the optical axis in order to correct aberrations caused by the thickness of the transmitting plate 3 provided on the reticle used actually.

Incidentally, in place of the displacement of the pattern-formed region PA1 or PA2 of the test reticle TR1 or TR2 in the direction of the optical axis, the position or posture of some optical members constituting the projection optical system may be altered.

In the foregoing, described is an instance in which the surface working of the transmitting plate 3 is carried out so as to correct the distortion in combination of the reticle (mask) with the projection optical system. In the following, the surface working of the transmitting plate 3 is carried out so as to correct the distortion on the reticle alone.

[(B) Procedure of Correcting Distortion on Reticle (Mask) Alone]

First, respective XY coordinates of the cross marks $M_{0,0}$ to $M_{8,8}$ of the test reticle TR2 shown in FIG. 10B are measured with a coordinate measuring instrument. Next, respective XY coordinates of the cross pattern elements $P_{0,0}$ to $P_{8,8}$ formed in the state the pattern surface 1P is provided are measured with a coordinate measuring instrument. Then, the procedure described previously is repeated to work the figure (surface form) of the transmitting plate 3 to displace the cross pattern elements $P_{0,0}$ to $P_{8,8}$ to ideal positions. Incidentally, in the case when the test reticle has the pattern as shown in FIG. 10A, it is commonly difficult to decide what position of the pattern be measured. Accordingly, in such a case, it is preferable to find each pattern position according to the procedure of interpolation made when the marks on the test reticle are not arranged on the lattice points of the square lattice.

In the foregoing, errors in pattern position of the test reticle TR2 are corrected. This method is also applicable to reticles used actually.

Third Embodiment

Third Embodiment of the present invention is described below with reference to FIGS. 14A to 14C. Incidentally, FIGS. 14A to 14C illustrate only a transmitting plate 3 provided on the side of the pattern-formed surface of a photomask, disposed apart by a stated interval from the pattern-formed surface. Here, as a method of supporting the transmitting plate 3 on the photomask, the method in the above First Embodiment and Second Embodiment may be used. Where the transmitting plate 3 the photomask has is substantially flat on its both surfaces, the angle formed by the both surfaces each other being represented by θ, the fringes of equal-thickness interference may less occur when $$\lambda/4n \leq 0 \quad (22)$$

is satisfied. Here. λ represents wavelength of light used when the flatness of the surface is measured; and n, refractive index of the transmitting plate 3 at that wavelength.

This is described with reference to FIG. 14A. In FIG. 14A, when X=0, showing a dark line, the number m of stripes when X=Xm and X is from 0 to Xm is represented by the following expression.

$$m \cdot \lambda = 2n \cdot hm = 2n \cdot Xm \cdot \theta \quad (23)$$

Here, with an increase in pitches of the stripes, interference fringes have denser intervals to gradually become unobservable. Taking account of the resolving power of the human naked eye, pitches of fringes which become unobservable are presumed to be 1 line/2 mm or more. This gives $$m/Xm = 2\theta \cdot n/\lambda(\text{mm}) \geq \tfrac{1}{2} \text{ (line/mm), and therefore } \lambda/4n \leq \theta \quad (22)$$

is the condition where the fringes of equal-thickness interference become unobservable.

Here, the light for the measurement of flatness need not be visible light. However, taking account of practical utility, the lower-limit value of λ is considered to be $$\lambda = 360 \text{ nm}.$$

Also, the transmittance can be ensured with exposure light of 200 nm or shorter wavelength, and, as a material having a high refractive index, $BaF_2$ is known for example. The refractive index of $BaF_2$ at 360 nm is, taking account of a scattering, too, $$n(BaF_2, 360 \text{ nm}) \leq 1.50.$$

$$\lambda/4n = 360 \times 10^{-6}/4 \times 1.50$$
$$= 6.0 \times 10^{-5} \text{ (rad)}$$
$$= 12.4''.$$

Thus, the lower-limit value of the condition (20) given previously may preferably be 12.4".

FIGS. 14B and 14C show a state where the transmitting plate 3 the photomask has is provided with an incline. The transmitting plate 3 is made of quartz and has a thickness of 0.1 mm. Also, the incline is standardized as $$25'' \leq \theta \leq 1' \quad (24).$$

When the figure tolerance (surface precision) is measured at a wavelength of 633 nm, refractive index n of the transmitting plate 3 at wavelength λ=633 nm is 1.4571. Therefore, $$\lambda/4n = 6.33 \times 10^{-6}/4 \times 1.4571$$
$$= 1.086 \times 10^{-4} \text{ (rad)}$$
$$= 22.4''.$$

Hence, the standard (24) in the present embodiment is understood to fulfill the condition (20).

The transmitting plate 3 also has an antireflection coating on each surface, and the surfaces on both the photomask side and the projection lens side are each constituted of a double-layer film of $LaF_3/MgF_2$ in order from the plate.

Fourth Embodiment

FIGS. 14D and 14E illustrate the construction of a transmitting plate 3 a photomask according to Fourth Embodiment of the present invention has. Incidentally, FIGS. 14D and 14E illustrate only the transmitting plate 3, and the photomask and the holding frame are omitted. Here, as a method of supporting the transmitting plate 3 on the photomask, the method in the above First Embodiment and Second Embodiment may be used.

The transmitting plate 3 in Fourth Embodiment is also provided with an incline. The transmitting plate 3 is made of fluorite and has a thickness of 0.3 mm. The incline of the transmitting plate is standardized as $$30'' \leq \theta \leq 1' \quad (25).$$

When the figure tolerance (surface precision) is measured at a wavelength of 550 nm, refractive index n of the transmitting plate 3 (fluorite) at wavelength λ

$$\lambda/4n = 5.50 \times 10^{-6}/4 \times 1.4349$$
$$= 9.583 \times 10^{-5} \text{ (rad)}$$
$$= 19.8''.$$

Hence, the standard (25) in the present embodiment is understood to fulfill the condition (20).

The transmitting plate 3 also has an antireflection coating on each surface, and the surfaces on both the photomask side and the projection lens side are each constituted of a five-layer film of $MgF_2/LaF_3/MgF_2/LaF_3/MgF_2$ in order from the plate. Incidentally, as the number of layer of the antireflection coating, the film is not limited to the double layer or five layer multiple layers, and may be a single-layer film.

Fifth Embodiment

Fifth Embodiment is described with reference to FIG. 14F, in which the surface of a transmitting plate 3 the photomask has is provided with a curvature. Think about an instance where the top surface of the transmitting plate 3 has a curvature φ as shown in FIG. 14F. Here, a curvature which is convex on the top surface is regarded as positive curvature. Since a gentle curvature is assumed, where in FIG. 14F the distance from a point of intersection with a tangential plane parallel to the bottom surface is represented by x, h can be approximated by the conventionally known, following Newton-Ring's formula:

$$h = -x^2 \Phi/2 \quad (26).$$

Here, in this transmitting plate 3, there is a possibility that interference fringes are observable, and it becomes necessary for the surface to have an inclination when, as stated previously in Third Embodiment, x=2 mm and $$\lambda \geq 2nh \quad (27),$$

where n is refractive index of the transmitting plate 3 in wavelength λ.

When x=2 mm is set in the expression (26) and substituted for the expression (27), it follows that $$\phi \geq -\lambda/(4n) \quad (28).$$

Also when conversely the transmitting plate 3 has a curvature φ which is convex on the top surface, the same argument as the above is established, giving, in combination with the expression (28), $$-\lambda/(4n) \leq \phi \leq \lambda/4 \quad (29).$$

Incidentally, an instance in which the top surface of the transmitting plate 3 has a curvature is assumed here, but the bottom surface may have a curvature. In short, what is important is the difference in power between the top surface and the bottom surface of the transmitting plate 3. Where the power of the top surface is represented by $\phi 1$, and the power of the bottom surface by $\phi 2$ ($\phi>0$ in the case of convex surface), the expression (29) is generalized in the following way.

$$-\lambda/(4n) \leq \phi 1 + \phi 2 \leq \lambda/4 \quad (30).$$

When the lower-limit value and upper-limit value of the expression (30) are determined, it follows that $\lambda \leq 800$ nm if the wavelength $\lambda$ is that of visible light. Also, the transmittance can be ensured at a wavelength of 200 nm or shorter and also LiF is known as a material having a low refractive index, which has a refractive index of $n \geq 1.388$.

Therefore, the expression (30) comes to be $$-1/6940 \leq \phi 1 + \phi 2 \leq 1/5000 \text{ (unit: 1/mm)}.$$

Sixth Embodiment

Sixth Embodiment of the present invention is described below with reference to FIGS. 15A and 15B. In the above embodiment shown in FIG. 7, in order to correct the aberrations caused by the thickness of the transmitting plate 3, the correction of aberrations is made on the projection optical system, inclusive of that of the thick transmitting plate 3, and the aberration variations ascribable to errors in the manufacture of the transmitting plate 3 are corrected by adjusting the position or posture of some optical members constituting the projection optical system. In Sixth Embodiment described below, the aberration variations ascribable to errors in the manufacture of the transmitting plate 3 are corrected by altering the distance between the projection optical system and the photomask 1.

Figure 15A:
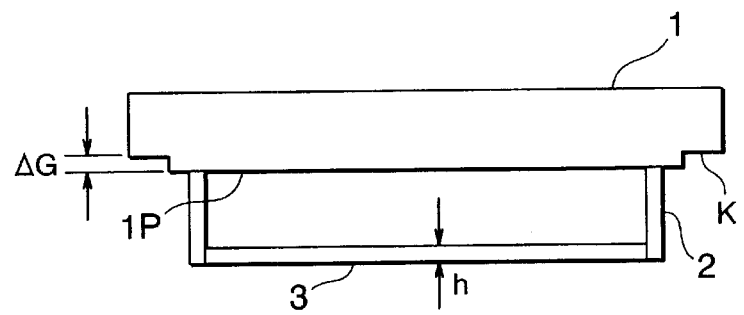
FIGS. 15A and 15B cross-sectionally illustrate a cutout and so forth of photomasks.
Figure 15B:
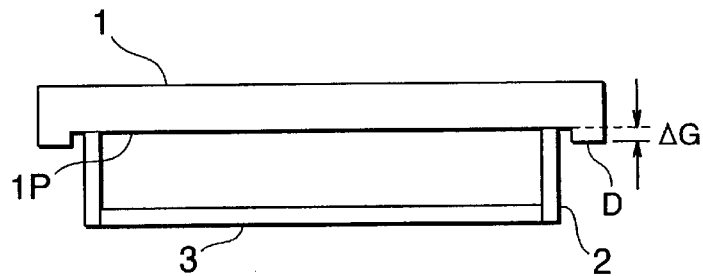

FIGS. 15A and 15B are side views of a photomask 1 according to Sixth Embodiment. Incidentally, in Sixth Embodiment, as a method of supporting the transmitting plate 3 on the photomask 1, the method in the above First Embodiment and Second Embodiment may be used.

The photomask 1 shown in FIG. 15A has a pattern region 1P in which a master pattern is formed, and a cutout surface K provided at the part where it comes into contact with the reticle stage of the projection exposure apparatus (the region where it is attracted by the reticle stage). A rectangular frame-like member, holding frame 2 is provided at the position surrounding the pattern region 1P at the under surface of the photomask 1 (the surface on the side of the pattern region 1P). Then, the transmitting plate 3 is fixed by the holding frame 2. Incidentally, the holding frame 2 and the transmitting plate 3 may be made of the same material as that used in the previous embodiments. As a method of attaching the holding frame 2 to the photomask 1 and a method of attaching the transmitting plate 3 to the holding frame 2, the same methods as those in the above First Embodiment and Second Embodiment may be used.

Because of a level difference (distance in the direction of a normal on the pattern-formed surface) $\Delta G$ between the cutout surface K of the photomask 1 and the pattern region 1P as shown in FIG. 15A, the pattern region 1P is set on the side lower than the mask reference surface determined by the reticle stage (i.e., on the projection optical system side or the wafer side). A method of determining this level difference $\Delta G$ is described below.

Optical path length between the pattern-formed surface 1P and the projection optical system changes with variations of the thickness h of the transmitting plate 3. Here, no aberration stands occurred at all on wavefronts in the optical path extending from the pattern-formed surface 1P to the projection optical system. Hence, as long as the optical path length between the pattern-formed surface 1P and the projection optical system is kept constant, the state of the wavefront entering the projection optical system does not change and the aberrations of the projection optical system do not vary. In the present embodiment, the level difference $\Delta G$ is provided so that the distance between the pattern-formed surface 1P and the projection optical system can be changed to compensate changes in optical path length which are caused by the variation of the thickness h of the transmitting plate 3, to prevent aberrations from varying.

The example shown in FIG. 15A corresponds to an instance in which aberrations of the projection optical system have been corrected in the state the transmitting plate 3 is not present (i.e., h=0). In order to cancel the portion of an increase in optical path length, caused by the thickness h of the transmitting plate 3, the distance of the pattern-formed surface 1P for the projection optical system is narrowed by $\Delta G$. Here, where the refractive index at exposure wavelength in an atmosphere in the optical path extending between the pattern-formed surface 1P and the projection optical system is represented by $n_0$, and the refractive index of the transmitting plate 3 at exposure wavelength by n, it follows that $$\Delta G = (n_0 \cdot h) - (n \cdot h).$$

In the example shown in FIG. 15A, taken into account is an instance in which aberrations of the projection optical system have been corrected or an instance in which the interval between the pattern-formed surface 1P and the projection optical system has been set, assuming a case in which the transmitting plate 3 has a thickness h of 0. As for the example shown in FIG. 15B, it is an example of an instance in which aberrations of the projection optical system have been corrected or an instance in which the interval between the pattern-formed surface 1P and the projection optical system has been set, assuming a case in which the transmitting plate 3 has a thickness h of a stated value.

The example shown in FIG. 15B is set up on the assumption that aberrations of the projection optical system have been corrected or the interval between the pattern-formed surface 1P and the projection optical system has been set when the transmitting plate 3 has a thickness h of 0.5 mm. In the example shown in FIG. 15B, since the transmitting plate 3 has a thickness h smaller than 0.5 mm, the photomask 1 is provided with a protrusion D at its part coming into contact with the reticle stage of the projection exposure apparatus (the region where it is attracted by the reticle stage).

Level difference (distance between the part coming into contact with the reticle stage and the pattern-formed surface 1P in the direction of a normal on the pattern-formed surface) $\Delta G$ at this projection is, where the extent of variation from the thickness reference value 0.5 mm of the transmitting plate 3 is represented by $\Delta h$, $$\Delta G = (n_0 \cdot \Delta h) - (n \cdot \Delta h).$$

Incidentally, in the example shown in FIG. 15B, the protrusion is provided in a form integral with the photomask, but need not be an integral member, and may be a spacer as an independent member. Here, taking account of the attraction (e.g., vacuum attraction or electrostatic attraction) of the photomask 1 to the reticle stage, the spacer as an independent member may preferably be fixed to the photomask by bonding or by optical contact.

Seventh Embodiment

In Sixth Embodiment as shown in FIGS. 15A and 15B, the photomask 1 is provided with the cutout surface K or the protrusion D so that the optical path length between the pattern-formed surface 1P of the photomask 1 and the projection optical system can be kept constant. The optical path length can also be kept constant by providing the reticle stage supporting the photomask, with a mechanism which changes the interval between the pattern-formed surface 1P and the projection optical system.

Figure 16:
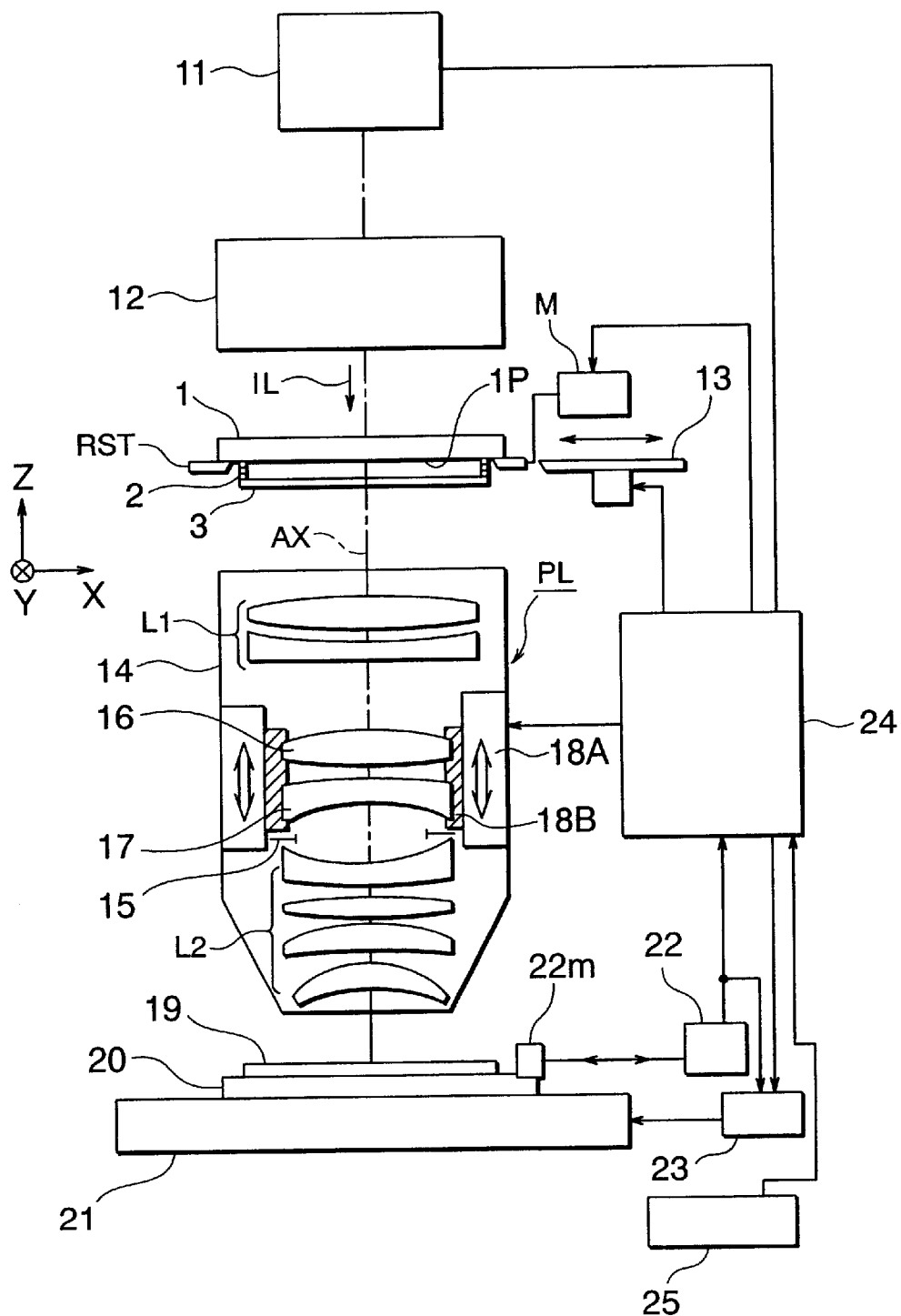
FIG. 16 schematically illustrates the construction of a projection exposure apparatus in which a reticle (photomask) according to an embodiment of the present invention is mounted.

FIG. 16 illustrates the construction of a projection exposure apparatus according to Seventh Embodiment. Members having the same function as that shown in FIG. 7 are denoted by like reference numerals. In the following, the same construction as that in FIG. 7 is omitted from description for simplification of the description.

In the projection exposure apparatus shown in FIG. 16, what differs from the construction shown in FIG. 7 is that a reticle stage up-and-down mechanism M for making the position of the photomask 1 adjustable in the direction of Z is provided.

In the projection exposure apparatus shown in FIG. 7, the aberration variations ascribable to thickness variations of the transmitting plate 3 of the photomask 1 are corrected by adjusting the position or posture of some optical members constituting the projection optical system PL. In the embodiment shown in FIG. 16, the variations are corrected by adjusting the interval between the pattern-formed surface 1P of the photomask 1 and the projection optical system PL.

As shown in FIG. 16, every time the reticle on the reticle stage RST is changed for another via the reticle loader 13, the main control system 24 reads the thickness h of the dustproof-purpose transmitting plate 3 disposed above the pattern surface 1P of the photomask 1 to be just being exposed; the thickness being read from an exposure data file recorded in the memory unit 25. Then, the extent of drive of the reticle stage up-and-down mechanism M for cancelling the level of changes in aberration of the projection optical system PL which are caused by this thickness h is determined, and the information on this extent of drive is sent out to the reticle stage up-and-down mechanism M. Thus, the interval between the pattern-formed surface 1P of the photomask 1 and the projection optical system PL is adjusted and ideal imaging characteristics are maintained. Incidentally, the extent of drive of the reticle stage up-and-down mechanism M can be calculated in the same manner as in Sixth Embodiment described above.

In the embodiment shown in FIG. 16, in the exposure data file recorded in the memory unit 25, not only the information concerning the thickness h of the transmitting plate 3 but also the information concerning the figure (surface form) such as curvature and inclination of the transmitting plate 3 may be kept stored so that the information concerning the figure (surface form) can also be utilized. In such a case, the main control system 24 determines the extent of change in position and posture of some optical members (e.g., lenses 16 and 17) in the projection optical system PL which is to cancel the level of changes in aberration of the projection optical system PL which are ascribable to the figure (surface form) of the transmitting plate 3, and sends out the information on this extent of change to a drive mechanism (e.g., 18A) for driving the optical members. Thus, the position and posture of the optical members are adjusted and ideal imaging characteristics are maintained.

In the embodiments shown in FIGS. 7 and 16, the $F_2$ laser of 157 nm wavelength is used as the light source. Alternatively, as the light source, also usable are those capable of supplying exposure light of 200 nm or shorter wavelength, such as an ArF excimer laser which supplies light of 193 nm wavelength, a $Kr_2$ laser which supplies light of 146 nm wavelength, a KrAr laser which supplies light of 134 nm wavelength, and an $Ar_2$ laser which supplies light of 126 nm wavelength.

As for the type of projection of the projection optical system PL, it may be not only the reduction projection, but also any of one-to-one projection and magnification projection.

Eighth Embodiment

Figure 17A:
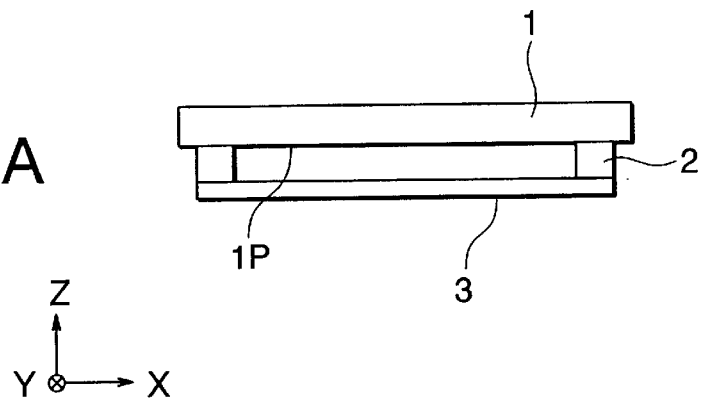
FIG. 17 schematically illustrates a reticle (photomask) according to an embodiment of the present invention.
Figure 17B:
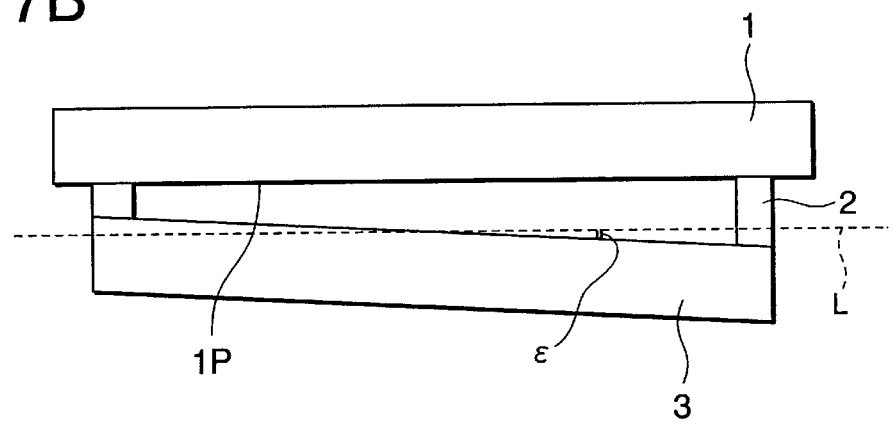

FIGS. 17A and 17B are side views of a photomask according to Eighth Embodiment. In FIG. 17, the same coordinate systems as those in FIGS. 1 and 2 are employed. As shown in FIG. 17A, a holding frame 2 having a rectangular frame-like external shape in the XY plane is attached on the outside of a pattern surface 1P of a photomask 1, and a transmitting plate 3 having transmission to exposure beams is attached to the holding frame 2 at its edge faces in the direction of Z (edges faces on the side opposite to the pattern surface 1P side of the holding frame 2).

In FIG. 17B, where the surface which is parallel to the pattern surface 1P is regarded as a reference surface L, an angle ϵ the transmitting plate 3 forms with respect to the reference surface L may preferably be within 1°. Here, if the angle ϵ is larger than 1°, decentration coma aberrations may occur from such a transmitting plate 3, undesirably.

In the case when the light of 200 nm or shorter wavelength is used as exposure wavelength as in the above embodiments, pattern images have a small line width and hence any tolerable decentration coma aberrations may occur in a small extent. Hence, in such a case, the angle ϵ may preferably be within 5'. Also, assume that an angular error ϵ in attachment of the transmitting plate 3 can not be allotted to other factors, the angle ϵ may preferably be within 1'.

Where the extent of decentration coma aberrations at the image surface is represented by ΔY, the image-side numerical aperture of the projection optical system PL by NA, the height of incidence of a pupil paraxial ray when the height of incidence of the pupil paraxial ray on the image plane by hp, the projection magnification of the projection optical system by N, and the axial thickness of the transmitting plate 3 by d, the angular error ϵ is expressed by the following expression (31).

$$\Delta Y = \frac{\varepsilon}{2} NA^2 \times 3 \times hp \times \alpha^4 \left(1 - \frac{1}{N^2}\right)\frac{d}{N} \quad (31)$$

Incidentally, in the expression (31), the unit of the angle ϵ is radian (rad).

Examples of numerical values are given below.

TABLE 4

$\epsilon = 1°$
NA = 0.75
$\alpha = ¼$
hp = 4
d = 0.3 mm
N = 1.56
$\Delta Y = 25$ nm Tolerable decentration coma aberrations $\Delta Y$ may be determined according to the resolution line width of a pattern image, whereby tolerable angular error $\epsilon$ can be calculated according to the expression (31).

Ninth Embodiment

Figure 18A:
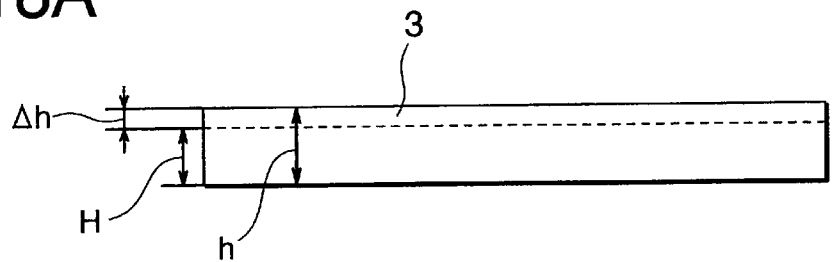
FIG. 18 schematically illustrates a reticle (photomask) according to an embodiment of the present invention.

FIG. 18A illustrates a transmitting plate of a photomask according to Ninth Embodiment. In FIG. 18A, the photomask and its holding frame are omitted from illustration. The transmitting plate 3 is held by a method according to any of First, Second and Eighth Embodiments described above.

In FIG. 18A, where the thickness of the transmitting plate 3 is represented by h, and the thickness of the transmitting plate 3 on designing (a specified value of the transmitting plate 3) by H, the transmitting plate 3 may preferably have a thickness tolerance $\Delta h$ ($\Delta h = h - H$) within ±2 µm. Here, its thickness tolerance $\Delta h$ beyond ±2 µm is not preferable because the distortion that may be caused by pupil aberrations (corresponding to telecentricity at each object height on the photomask 1 side) of the projection optical system may come to be a value not negligible. Incidentally, this thickness tolerance $\Delta h$ is determined without regard to the thickness H of the transmitting plate 3 on designing.

Tenth Embodiment

Figure 18B:
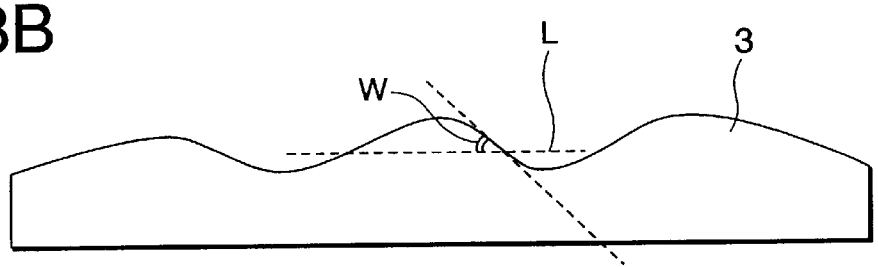
Figure 18C:
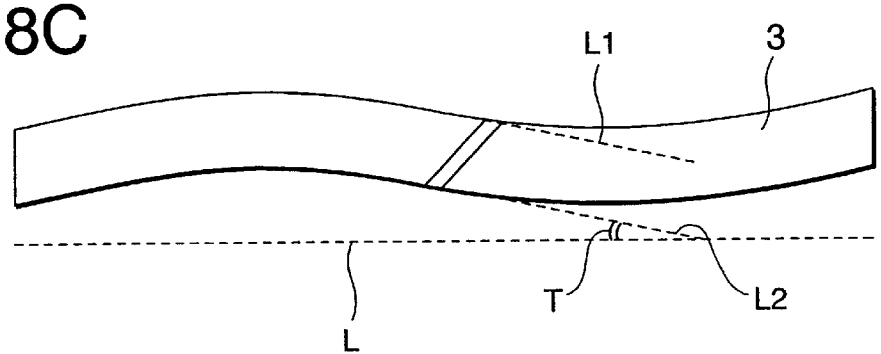

FIGS. 18B and 18C each illustrate a transmitting plate of a photomask according to Tenth Embodiment. In FIGS. 18B and 18C, the photomask and its holding frame are omitted from illustration. The transmitting plate 3 is held by a method according to any of First, Second and Eighth Embodiments described above.

In FIG. 18B, a stated reference surface is represented by L (typically the reference surface L is parallel to the pattern surface). Here, an angle W a tangential plane of the light transmission surface of the transmitting plate 3 forms with respect to the reference surface L may preferably be within 0.4" even as an angle W corresponding to any spot of the light transmission surface Here, an angle W greater than 0.4" is not preferable because the distortion caused by the transmitting plate 3 may be too great.

In FIG. 18C, where the first surface and second surface of the transmitting plate 3 are in parallel, an angle T a tangential plane L1 and a tangential plane L2 of these first and second surfaces form with respect to the reference surface L may also preferably be within 12" even as an angle T corresponding to any spot of the light transmission surface. Here, an angle T greater than 12" is not preferable because the distortion caused by the transmitting plate 3 may be too great.

The present invention is also applicable to both a step-and-repeat method (batch exposure method) in which the mask pattern image is transferred one at a time to one shot region on the wafer, thereafter the wafer is successively two-dimensionally moved in a plane falling at right angles with the optical axis of the projection optical system, then the mask pattern image is transferred one at a time to the next shot region, and this step is repeated, and a step-and-scan method (scanning exposure method) in which at the time of exposure onto each shot region of the wafer the mask and the wafer are synchronizingly scanned with respect to the projection optical system, setting a projection magnification $\beta$ as velocity ratio. Incidentally, in the step-and-scan method, it is satisfactory if at least good imaging characteristics are obtained in slit-like (e.g., slender rectangular) exposure regions. Hence, the pattern can be exposed onto broader shot regions on the wafer without necessity of making the projection optical system large-sized.

Now, the photomask of the present invention can be produced by a process described below. A process for producing the photomask is described below with reference to a flow chart shown in FIG. 19.

Figure 19:
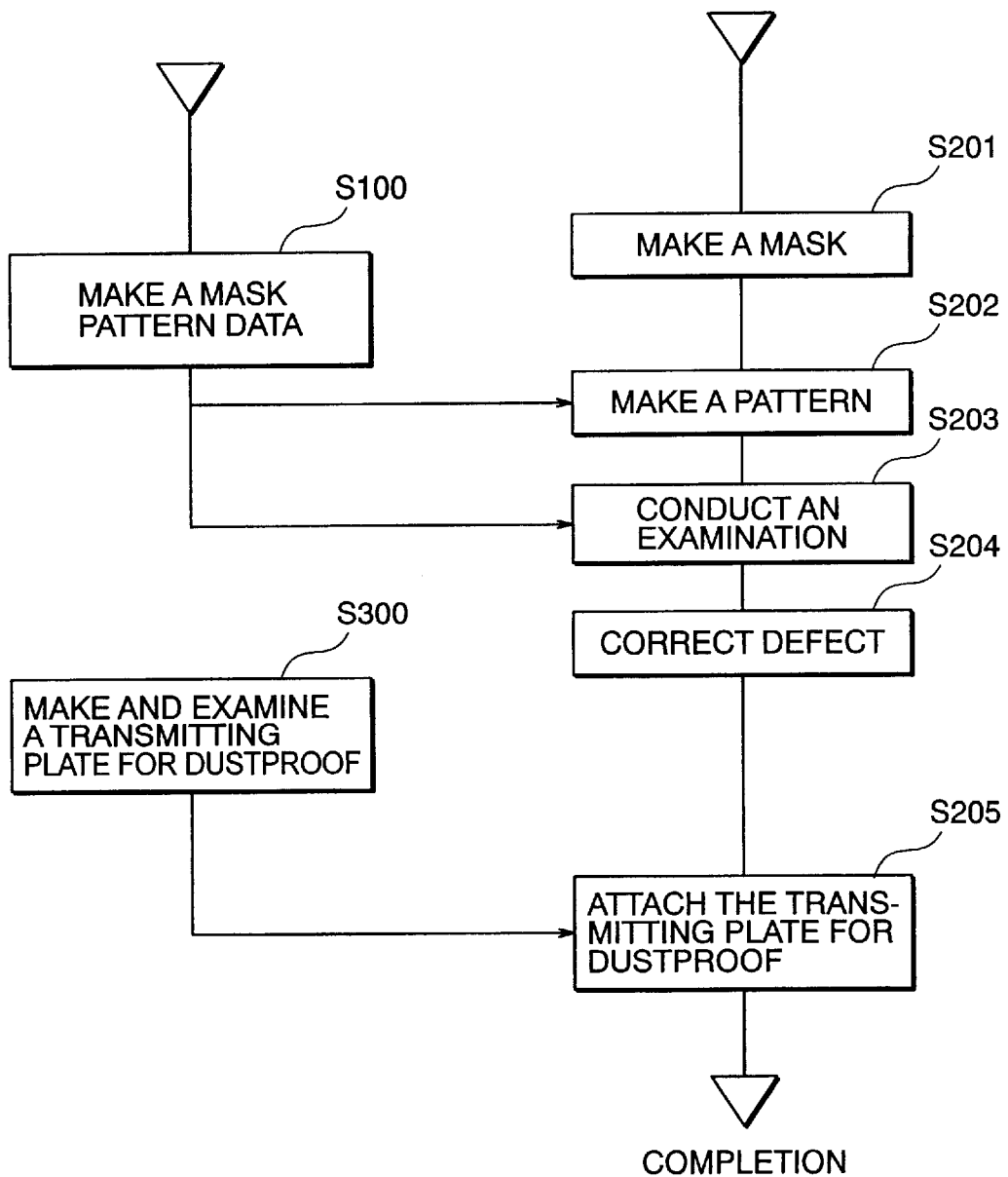
FIG. 19 is a flow chart showing an example of steps for producing the photomask according to the present invention.

As shown in FIG. 19, data of the mask pattern are prepared in a step S100. In parallel to this step S100, a mask plate comprised of the transmitting plate is also prepared in a step 201. In this step S201, the mask plate material such as quartz or the above modified quartz is prepared by grinding and polishing, and thereafter a light-screening film of chromium or the like is formed on the surface by vacuum deposition or sputtering. Also, in this step S201, a photosensitive resin (resist) is commonly coated on the mask in advance. Incidentally, in the case when the mask is provided with the cutout along its border (the position at which the mask is placed on the stage), it may preferably be done in this step S201.

In a step S202, a pattern is drawn on the mask plate coated with the photosensitive resin, in accordance with the data of the mask pattern formed in the step S100, followed by processing such as development, post-baking, scumming, etching and resist removal to form a pattern on the mask plate. Incidentally, as methods for drawing the pattern on the mask plate, usable are not only a lithographic method making use of an electron exposure apparatus but also a lithographic method making use of an exposure apparatus in which circuit patterns are transferred to glass substrates from a mother reticle as disclosed in, e.g., WO99/34255, WO99/50712 and WO99/66370.

In a step S203, the data of the mask pattern formed in the step S100 and the pattern prepared in the step S202 are examined by comparing them from the viewpoints of pattern dimensional precision, pattern positional precision and external appearance quality.

In a step S204, any defects such as white defects, black defects and semitransparent defects of the mask pattern are corrected by spot exposure, shifting-off, laser beam processing, laser CVD, ion beam processing or the like in accordance with the results of examination made in the step S203.

In parallel to he above steps S201 to 204, the transmitting plate for dust proofing is prepared in a step S300. To prepare this plate for dust proofing, first, the plate material such as quartz or the above modified quartz is prepared by grinding and polishing, and examination is made on whether or not the thickness, figure (surface form) (surface flatness), internal defects, refractive index distribution and so forth of the plate material come up to the standards described in the above embodiments, and its surface is provided with the antireflection coating.

In a step S205, any foreign matter adhering to the photomask is removed by precision cleaning and thereafter the transmitting plate for dustproofing, prepared in the step S300 is attached to the photomask via the holding frame. Incidentally, in the case when the transmitting plate for dustproofing is provided with angles of inclination on its two light transmitting surfaces, the direction of the inclination may preferably be made uniform for each photomask.

In the case when the mask is provided with a protrusion like that in Sixth Embodiment along its border (the position at which the mask is placed on the stage), it may also preferably be done in this step S205.

Then, final quality of the photomask to which the transmitting plate for dustproofing has been attached is inspected by foreign matter examination and so forth, thus the photomask according to the present invention is produced.

By the way, in the embodiments described above, the present invention is applied to projection exposure apparatus used in the fabrication of semiconductor devices. Without limitation to such projection exposure apparatus used in the fabrication of semiconductor devices, the present invention is also applicable to, e.g., exposure apparatus for transferring device patterns onto glass plates, used in the manufacture of displays including liquid-crystal display devices; exposure apparatus for transferring device patterns onto ceramic wafers, used in the manufacture of thin-film magnetic heads; and exposure apparatus used in the manufacture of imaging devices (such as CCD). The present invention is still also applicable to exposure apparatus for transferring circuit patterns onto silicon wafers, used to produce reticles or masks.

Needless to say, the present invention is by no means limited to the embodiments described above, and may be constructed in variety within the gist of the present invention.

POSSIBILITY OF INDUSTRIAL APPLICATION

As described above, the present invention can provide a photomask which has a sufficient durability to short-wavelength exposure beams, too, and also can prevent any foreign matter from adhering to patterns for transfer.

The present invention can also provide a photomask in which the figure tolerance (surface precision) of the transmitting plate can be measured with ease and also the transmitting plate is low reflective, and to provide a photomask which can make aberrations less occur even when the transmitting plate has a variety in thickness.

In addition, the projection exposure apparatus and projection exposure process of the present invention can projection-expose fine transfer patterns at a high precision and without aberrations and at a high throughput.

What is claimed is:

1. A projection exposure apparatus in which a pattern for transfer which has been formed on the pattern surface of a photomask is illuminated by an exposure beam coming from an illumination optical system and an image of the pattern is formed on a photosensitive substrate via a projection optical system; the projection exposure apparatus comprising;
    a mask stage for positioning the photomask in the optical path extending between the illumination optical system and the projection optical system; and
    a mask stage drive for moving the mask stage so that the interval between the pattern surface and the projection optical system comes to be at a given value;
    said photomask having a transmitting member having transmission to the exposure beam, disposed apart from the pattern surface by a stated interval; and
    said given value being determined in accordance with the thickness of the transmitting member of the photomask.

2. A projection exposure process in which a pattern for transfer which has been formed on the pattern surface of a photomask is illuminated by an exposure beam coming from an illumination optical system and an image of the pattern is formed on a photosensitive substrate via a projection optical system, said photomask having a transmitting member having transmission to the exposure beam, disposed apart from the pattern surface by a stated interval; the process comprising the steps of:
    locating the photomask in an optical path extending between the illumination optical system and the projection optical system; and
    setting an interval between the pattern surface and the projection optical system at a value determined in accordance with the thickness of the transmitting member of the photomask.

3. The projection exposure process according to claim 2, wherein said interval setting step includes a step of moving a mask stage for positioning said photomask in the light path between said illumination optical path and said projection optical system.

4. A photomask to be mounted on a projection exposure apparatus with which a pattern for transfer which has been formed on the pattern surface of the photomask is projection-exposed onto a photosensitive substrate by the aid of an exposure beam;
    said photomask comprising;
        a transmitting member having transmission to the exposure beam, disposed apart from the pattern surface by a stated interval; and
        a mounting surface supported by a mask stage of the projection exposure apparatus;
        said mounting surface of the photomask and said pattern surface being set apart by a stated distance in the thickness direction of the transmitting member;
        said stated distance being determined taking account of the thickness of the transmitting member.

5. A projection exposure process comprising the steps of;
    illuminating the photomask according to claim 4, by the aid of the exposure beam coming from the illumination optical system; and
    forming on a photosensitive substrate via the projection optical system an image of a pattern for transfer which has been formed on the photomask.

6. The photomask according to claim 4, which fulfills at least one condition of the following conditions (a'), (b') and (c):

$$|\Delta Tc'| \leq 0.1\lambda, \tag{a'}$$

$$|\Delta \Phi c'| \leq 0.1\lambda, \tag{b'}$$

$$|\Delta n| \times h < 0.1\lambda, \tag{c}$$

where;

λ: wavelength (m) of the exposure beam;

ΔTc': maximum width (cm) of deviation of the thickness of the transmitting member from a linear approximation obtained when the thickness is linearly approximated;

ΔΦc': maximum width (cm) of deviation of the isophase plane of plane waves made incident on the transmitting member and having passed through the transmitting member, from a linear approximation obtained when the isophase plane is linearly approximated;

Δn: difference in refractive index of the transmitting member with respect to the exposure beam, between its maximum value and its minimum value; and h: thickness (cm) of the transmitting member.

7. A process for producing a photomask on which a pattern for transfer is formed and is to be irradiated by a stated exposure beam; the process comprising the steps of:

preparing a transmitting member having transmission to the exposure beam;

forming on the photomask a pattern for transfer; and attaching the transmitting member to the photomask in such a way that the transmitting member stands apart by a stated interval from the surface where the pattern for transfer has been formed;

said step of preparing the transmitting member having an auxiliary step of examining the transmitting member with respect to at least one of the thickness, isophase and refractive index.

8. A process for producing a photomask on which a pattern for transfer is formed and is to be irradiated by a stated exposure beam; the process comprising the steps of:

preparing a transmitting member having transmission to the exposure beam;

forming on the photomask a pattern for transfer; and attaching the transmitting member to the photomask in such a way that the transmitting member stands apart by a stated interval from the surface where the pattern for transfer has been formed;

said step of preparing the transmitting member having an auxiliary step of examining the transmitting member, wherein at least one condition of the following conditions (a'), (b') and (c) is examined in the step of preparing the transmitting member:

$$|\Delta Tc'| \leq 0.1\lambda, \quad (a')$$

$$|\Delta \Phi c'| \leq 0.1\lambda, \quad (b')$$

$$|\Delta n| \times h < 0.1\lambda, \quad (c)$$

where;

$\lambda$: wavelength (m) of the exposure beam;

$\Delta Tc'$: maximum width (cm) of deviation of the thickness of the transmitting member from a linear approximation obtained when the thickness is linearly approximated;

$\Delta \Phi c'$: maximum width (cm) of deviation of the isophase plane of plane waves made incident on the transmitting member and having passed through the transmitting member, from a linear approximation obtained when the isophase plane is linearly approximated;

$\Delta n$: difference in refractive index of the transmitting member with respect to the exposure beam, between its maximum value and its minimum value; and $h$: thickness (cm) of the transmitting member.

* * * * *